United States Patent
Miyake et al.

(10) Patent No.: US 10,249,644 B2
(45) Date of Patent: Apr. 2, 2019

(54) SEMICONDUCTOR DEVICE AND MANUFACTURING METHOD OF THE SAME

(71) Applicant: Semiconductor Energy Laboratory Co., Ltd., Atsugi-shi, Kanagawa-ken (JP)

(72) Inventors: Hiroyuki Miyake, Tochigi (JP); Koji Kusunoki, Kawasaki (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 151 days.

(21) Appl. No.: 15/041,356

(22) Filed: Feb. 11, 2016

(65) Prior Publication Data
US 2016/0240562 A1    Aug. 18, 2016

(30) Foreign Application Priority Data

Feb. 13, 2015 (JP) ................... 2015-026867
Feb. 13, 2015 (JP) ................... 2015-026947

(51) Int. Cl.
*G02F 1/1368* (2006.01)
*H01L 27/12* (2006.01)
(Continued)

(52) U.S. Cl.
CPC ........ *H01L 27/1225* (2013.01); *G02F 1/1368* (2013.01); *G02F 1/134363* (2013.01);
(Continued)

(58) Field of Classification Search
CPC .............. H01L 29/24; H01L 29/7869; H01L 29/78648; H01L 27/1225; H01L 27/1255; H01L 29/78645
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044 A    12/2006
EP    2226847 A    9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — David Spalla
(74) *Attorney, Agent, or Firm* — Robinson Intellectual Property Law Office; Eric J. Robinson

(57) ABSTRACT

An object is to provide a display device with high productivity by reducing the number of masks and the number of steps. Another object is to provide a display device with high yield. A pixel transistor and a driver transistor are formed over a substrate having an insulating surface in the same step. A pixel electrode electrically connected to the pixel transistor is one electrode. The other electrode is supplied with a fixed potential. A region where a pair of electrodes overlap with each other is used as a capacitor. Accordingly, the number of masks and steps are reduced to provide a display device with high productivity.

24 Claims, 19 Drawing Sheets

(51) Int. Cl.
  *H01L 29/786* (2006.01)
  *H01L 29/24* (2006.01)
  *G02F 1/1343* (2006.01)
  *G02F 1/1345* (2006.01)
  *G02F 1/1362* (2006.01)

(52) U.S. Cl.
  CPC .......... *H01L 27/1255* (2013.01); *H01L 29/24* (2013.01); *H01L 29/7869* (2013.01); *H01L 29/78648* (2013.01); *H01L 29/78696* (2013.01); *G02F 1/13454* (2013.01); *G02F 2001/134372* (2013.01); *G02F 2001/136231* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,102,476 B2 | 1/2012 | Son et al. |
| 8,551,824 B2 | 10/2013 | Yamazaki et al. |
| 8,916,424 B2 | 12/2014 | Isobe et al. |
| 8,945,982 B2 | 2/2015 | Yamazaki |
| 8,999,773 B2 | 4/2015 | Hanaoka et al. |
| 9,117,662 B2 | 8/2015 | Isobe et al. |
| 9,153,436 B2 | 10/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2011/0031493 A1* | 2/2011 | Yamazaki ........... H01L 27/1214 257/43 |
| 2011/0032435 A1 | 2/2011 | Kimura |
| 2011/0156025 A1* | 6/2011 | Shionoiri ............ H01L 27/115 257/43 |
| 2011/0212569 A1 | 9/2011 | Yamazaki et al. |
| 2011/0263091 A1 | 10/2011 | Yamazaki |
| 2013/0193432 A1 | 8/2013 | Yamazaki |
| 2013/0203214 A1 | 8/2013 | Isobe et al. |
| 2013/0267068 A1 | 10/2013 | Hanaoka et al. |
| 2014/0034954 A1 | 2/2014 | Yamazaki et al. |
| 2014/0042432 A1 | 2/2014 | Yamazaki |
| 2014/0042443 A1 | 2/2014 | Yamazaki |
| 2014/0106504 A1 | 4/2014 | Yamazaki et al. |
| 2014/0139775 A1* | 5/2014 | Miyake ............. H01L 29/78648 349/46 |
| 2014/0206133 A1 | 7/2014 | Koezuka et al. |
| 2016/0225795 A1 | 8/2016 | Koezuka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| | | |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-175715 A | 9/2013 |
| JP | 2014-063141 A | 4/2014 |
| JP | 2014-199402 A | 10/2014 |
| JP | 2014-199899 A | 10/2014 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-film Transistors", IEEE Transitions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2643.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT"SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Peformance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N. et al., "SPINEL,YBFE2O4, and YB2FE3O7 Types of Structures for Compounds in the IN2O3 and SC2O3-A2O3-BO Systems [A; Fe, Ga, Or Al; B; Mg, Mn, Fe, Ni, Cu,or Zn]at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5) InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev, Lett. (Physical Review Letters), Jan. 26, 2007, vol. 98, pp. 045501-1-045501-4.

Lee.H et al,, "Current Status of, Challenges to, and Perspective View of AM-OLED ", IDW '06 : Proceedings of the 13TH International Display Workshops, Dec. 7, 2006, pp. 663-666.

Lee.J et ai., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review, B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al "Amorphous In—Ga—Zn-Oxide TFTs with Suppressed Variation for 4.0 inch QVGA AMOLED Display". AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor upon exposure to water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Parks.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-IN. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9TH International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev, Lett. (Physical Review Letters), Jul. 31, 2000, vol. 85, No. 5, pp. 1012-1015.

\* cited by examiner

1400

1401 1402 1403

1410  1414  1412

1411  1413
1415

1420  1424
1421  1422
1423

SEMICONDUCTOR DEVICE AND MANUFACTURING METHOD OF THE SAME

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. The present invention particularly relates to a semiconductor device, a display device, or a light-emitting device each including an oxide semiconductor, for example.

Note that in this specification, a semiconductor device refers to any device that can function by utilizing semiconductor characteristics, and an electro-optical device, a semiconductor circuit, and an electronic device are all included in the category of semiconductor devices.

2. Description of the Related Art

In recent years, flat panel displays such as liquid crystal displays (LCDs) are becoming widespread. In each of pixels provided in the row direction and the column direction in a display device such as a flat panel display, a transistor serving as a switching element, a liquid crystal element electrically connected to the transistor, and a capacitor connected to the liquid crystal element in parallel are provided.

As a semiconductor material for forming a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, techniques for forming transistors including zinc oxide or an In—Ga—Zn-based oxide semiconductor are disclosed (see Patent Documents 1, 2 and 3).

REFERENCE

Patent Document

[Patent Document 1] Japanese Published Patent Application No. 2014-63141
[Patent Document 2] Japanese Published Patent Application No. 2014-199402
[Patent Document 3] Japanese Published Patent Application No. 2014-199899

SUMMARY OF THE INVENTION

As application of a transistor including an oxide semiconductor layer becomes widespread, reliability has been requested from various aspects. Thus, it is an object of one embodiment of the present invention to obtain a transistor including an oxide semiconductor layer, which has stable electrical characteristics. It is another object thereof to provide a highly reliable display device including the transistor.

Another object is to provide a display device which can operate at high speed. Another object is to provide a display device with low power consumption. Another object is to provide a display device with high productivity, in which the number of masks and the number of steps are reduced. Another object is to provide a display device with high yield.

Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems

A pixel transistor and a driver transistor are formed over a substrate having an insulating surface in the same steps. A pixel electrode electrically connected to the pixel transistor is one electrode. The other electrode is supplied with a fixed potential. A region where a pair of electrodes overlap with each other is used as a capacitor. Thus, the number of masks and the number of steps are reduced to provide a display device with high productivity.

The driver transistor includes a first gate electrode and a second gate electrode. The second gate electrode is formed in the same step as the electrode supplied with a fixed potential (also referred to as a common electrode).

An embodiment of the invention disclosed in this specification is a semiconductor device including, over an insulating surface, a first transistor, a first electrode electrically connected to the first transistor, a second transistor, a second electrode electrically connected to the second transistor, and a third electrode supplied with a fixed potential. The second electrode and the third electrode are formed in the same step. The first and third electrodes and an insulating film provided therebetween form a capacitor.

In a display device with the above structure, the first transistor is a switching element provided in a pixel portion, and the first electrode electrically connected to the first transistor is a pixel electrode. Another embodiment of the present invention is a display module including the display device and a touch sensor. Another embodiment of the present invention is an electronic device including the semiconductor device according to any of the above structures, the display device, or the display module, and an operation key or a battery.

In the above structure, the second transistor is a transistor in a driver circuit.

In the above structure, the first transistor includes a first oxide semiconductor layer and a second oxide semiconductor layer in contact with the first oxide semiconductor layer.

In the above structure, the second transistor in the driver circuit includes a stack of oxide semiconductor layers, a first insulating film over a channel formation region, a second gate electrode over the first insulating film, and a second insulating film over the second gate electrode. The second gate electrode and the common electrode are formed over the first insulating film. The second gate electrode and the common electrode are covered with the second insulating film. The pixel electrode is provided over the second insulating film.

Further, in order to increase the capacitance, after the oxide semiconductor film which is formed in the same step as a channel formation region of the pixel transistor is changed to a low-resistance oxide semiconductor film, i.e., an n-type (e.g., $n^-$-type or $n^+$-type) oxide semiconductor film, a protective insulating layer (e.g., a silicon nitride film) in contact with the n-type oxide semiconductor film is formed, whereby the oxide semiconductor film has lower resistance and serves as an electrode. This electrode and the electrode supplied with a fixed potential form a second capacitor.

An embodiment of the invention disclosed in this specification is a semiconductor device including, over an insulating surface, a first transistor, a first electrode electrically connected to the first transistor, a second transistor, a second electrode electrically connected to the second transistor, a third electrode supplied with a fixed potential, and a fourth electrode electrically connected to the first electrode. The second electrode and the third electrode are formed in the same step. The first and third electrodes and a first insulating film provided therebetween form a first capacitor. The third and fourth electrodes and a second insulating film provided therebetween form a second capacitor.

In the above structure, the first transistor is a switching element provided in a pixel portion. The first electrode electrically connected to the first transistor is a pixel electrode.

In the above structure, the second transistor is a transistor in the driver circuit.

In the above structure, the first transistor includes a first oxide semiconductor layer and a second oxide semiconductor layer in contact with the first oxide semiconductor layer.

In the above structure, the fourth electrode is a conductive metal oxide.

In the above structure, the first capacitor and the second capacitor overlap with each other. Since the region where the first capacitor and the second capacitor overlap with each other has a light transmitting property, the aperture ratio can be increased.

According to one object of one embodiment of the present invention, a change in electrical characteristics can be inhibited and reliability can be improved in a semiconductor device using a transistor including an oxide semiconductor. Alternatively, according to one embodiment of the present invention, a semiconductor device with low power consumption can be provided. According to one embodiment of the present invention, a novel semiconductor device can be provided. According to one embodiment of the present invention, a method for manufacturing a novel semiconductor device can be provided. According to one embodiment of the present invention, a method for manufacturing a highly reliable semiconductor device at a relatively low temperature can be provided. According to one embodiment of the present invention, a novel display device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

DETAILED DESCRIPTION OF THE INVENTION

Figure 1:
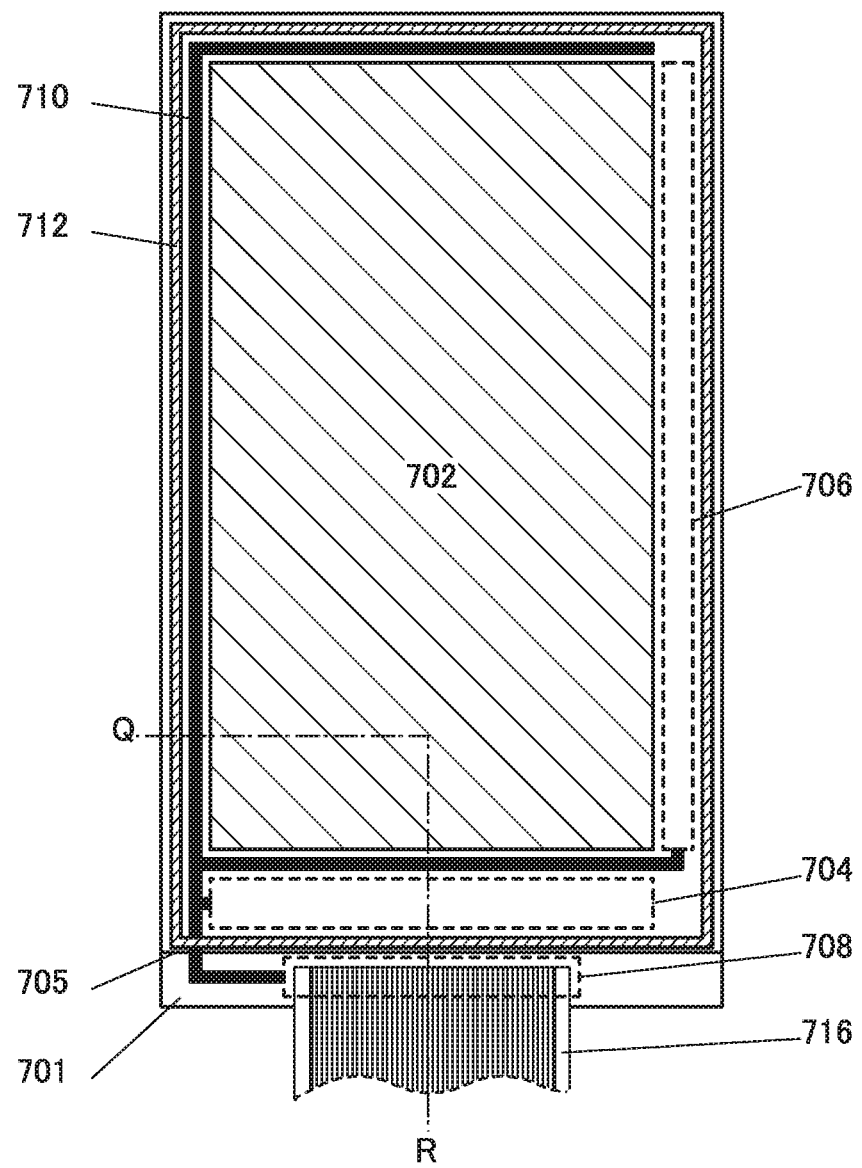
FIG. 1 is a top view illustrating one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

In describing structures of the invention with reference to the drawings in this specification and the like, common reference numerals are used for the same portions in different drawings.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

In this specification and the like, the terms "film" and "layer" can be switched depending on the case. For example, the term "conductive layer" can be changed into the term "conductive film" in some cases. Also, the term "insulating film" can be changed into the term "insulating layer" in some cases.

Embodiment 1

In this embodiment, an example of a display device including a transistor is described with reference to FIG. 1 and FIG. 2.

FIG. 1 is a top view of an example of a display device. A display device 700 illustrated in FIG. 1 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 1, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a connection electrode 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the connection electrode 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by the electrical or magnetic effect of these elements may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

In this embodiment, a structure including a liquid crystal element as a display element is described with reference to FIG. 2. Note that FIG. 2 is a cross-sectional view along the dashed-dotted line Q-R shown in FIG. 1 and shows a structure including a liquid crystal element as a display element.

Figure 2:
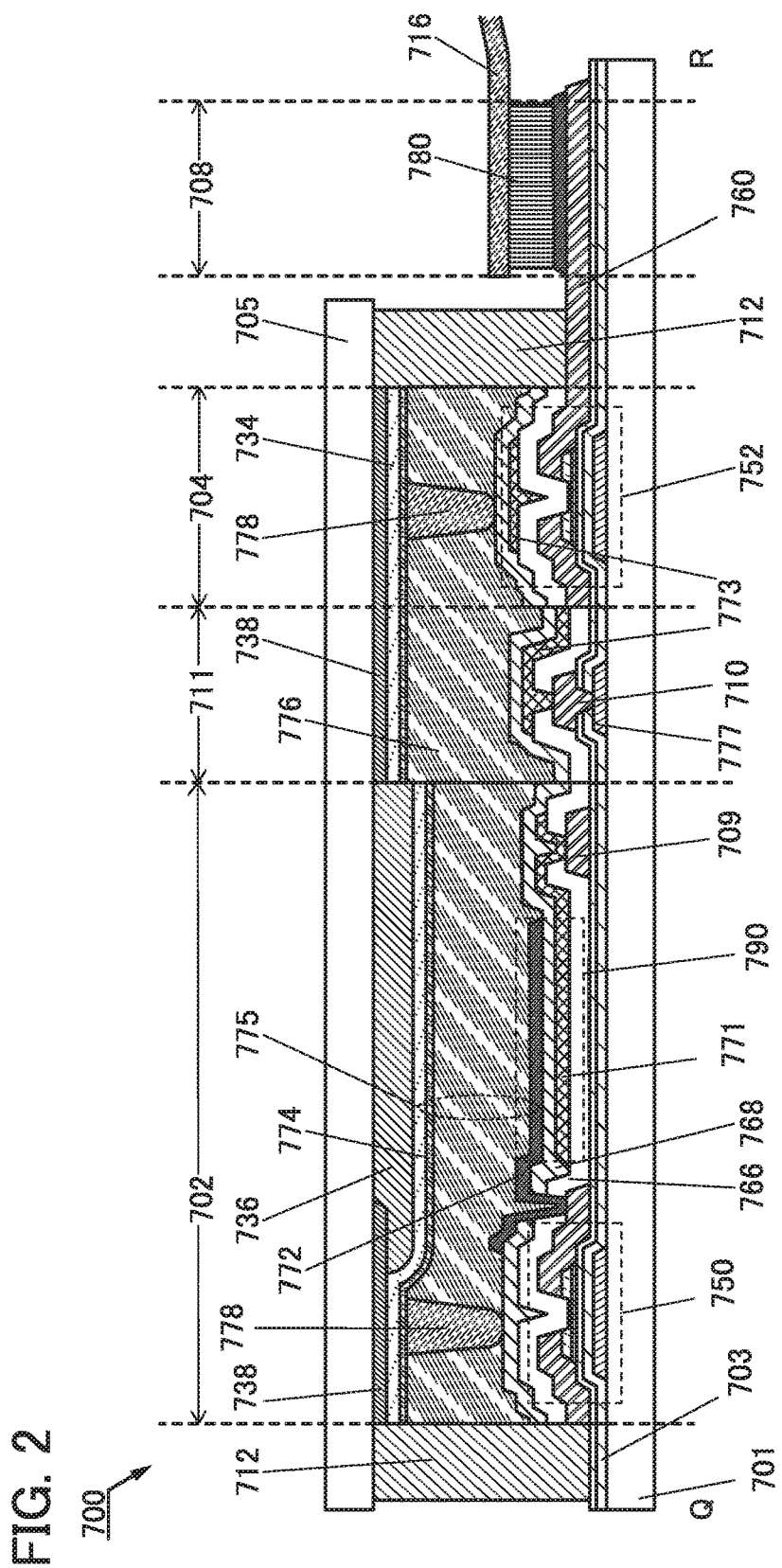
FIG. 2 is a cross-sectional view of one embodiment of the present invention.
Figure 3A:
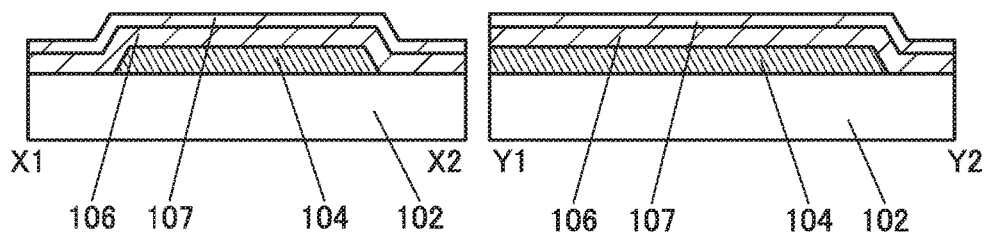
FIGS. 3A to 3C are cross-sectional views illustrating an example of manufacturing process of a semiconductor device.
Figure 3B:
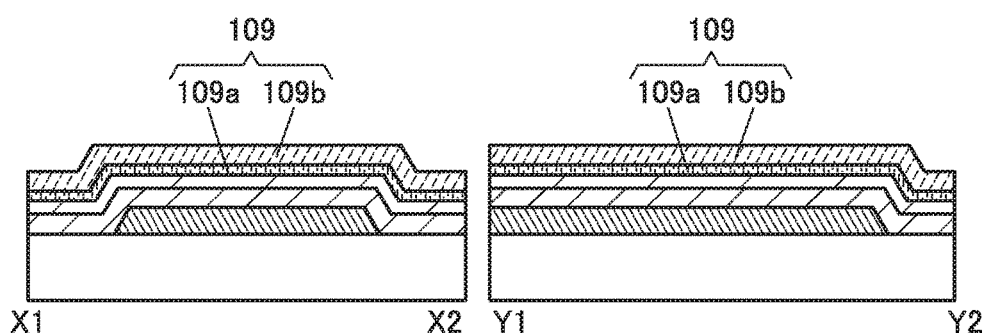
Figure 3C:
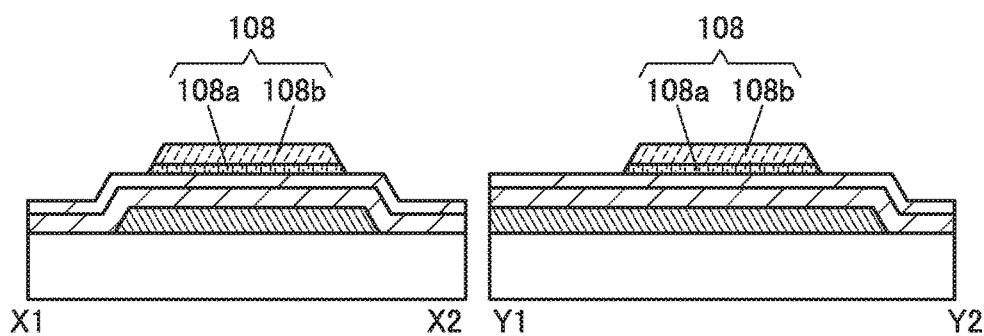

The display device 700 illustrated in FIG. 2 includes a connection portion 711, the pixel portion 702, the source driver circuit portion 704, and the FPC terminal portion 708. The connection portion 711 includes a connection electrode 777, the connection electrode 710, and a conductive film 773. The pixel portion 702 includes a transistor 750 and a capacitor 790. The source driver circuit portion 704 includes a transistor 752.

Any of the transistors described below in Embodiment 2 can be used as the transistors 750 and 752.

The transistors used in this embodiment each include an oxide semiconductor film which is highly purified and in which formation of oxygen vacancies is suppressed. In the transistor, the current in an off state (off-state current) can be made small. Accordingly, an electrical signal such as a video signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a dielectric between a pair of electrodes. Specifically, a conductive film 772 serving as a pixel electrode is used as one electrode of the capacitor 790, and a common electrode 771 that is formed in the same step as the gate electrode of the transistor 752 is used as the other electrode of the capacitor 790. An insulating film 768 is used as the dielectric between the pair of electrodes.

In the case where the display device 700 is a transmissive liquid crystal display device, a conductive film that transmits visible light is preferably used as a conductive film 772 and a common electrode 771. For example, a material including one kind selected from indium (In), zinc (Zn), and tin (Sn) is preferably used for the conductive film that transmits visible light.

The common electrode 771 is electrically connected to a capacitor line 709.

The connection electrode 710 and the capacitor line 709 are formed in the same step as conductive films serving as source electrodes and drain electrodes of the transistors 750 and 752.

Note that the connection electrode 710 and the capacitor line 709 may be formed using a conductive film which is formed in a different step from source electrodes and drain electrodes of the transistors 750 and 752; for example, a conductive film serving as a gate electrode may be used. In the case where the connection electrode 710 and the capacitor line 709 are formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same step as conductive films serving as source electrodes and drain electrodes of the transistors 750 and 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the second substrate 705 side is illustrated as an example in this embodiment, one embodiment of the present invention is not limited thereto. For example, a structure in which the structure body 778 is provided on the first substrate 701 side, or a structure in which both of the first substrate 701 and the second substrate 705 are provided with the structure body 778 may be employed.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

The display device 700 in FIG. 2 includes a liquid crystal element 775. The liquid crystal element 775 includes the conductive film 772, a conductive film 774, and a liquid crystal layer 776. The conductive film 774 is provided on the second substrate 705 side and functions as a counter electrode. The display device 700 in FIG. 2 is capable of displaying an image in such a manner that light transmission or non-transmission is controlled by change in the alignment state of the liquid crystal layer 776 depending on a voltage applied between the conductive film 772 and the conductive film 774.

The conductive film 772 is connected to the conductive film functioning as a source electrode or a drain electrode included in the transistor 750. The conductive film 772 is formed over the insulating film 768 to function as a pixel electrode, i.e., one electrode of the display element.

Note that the display device 700 in FIG. 2 is a reflective color liquid crystal display device, but the display type is not limited thereto. For example, a conductive film that reflects visible light may be used as a conductive film 772 to form a reflective display device. In that case, the display device 700 is what is called a reflective color liquid crystal display device in which external light is reflected by the conductive film 772 to display an image through the coloring film 736. For example, a material including aluminum or silver may be used for the conductive film that reflects visible light.

Although not illustrated in FIG. 2, an alignment film may be provided on a side of the conductive film 772 in contact with the liquid crystal layer 776 and on a side of the conductive film 774 in contact with the liquid crystal layer 776. Although not illustrated in FIG. 2, an optical member (optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. In addition, the liquid crystal composition which includes liquid crystal exhibiting a blue phase and a chiral material has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

Figure 13:
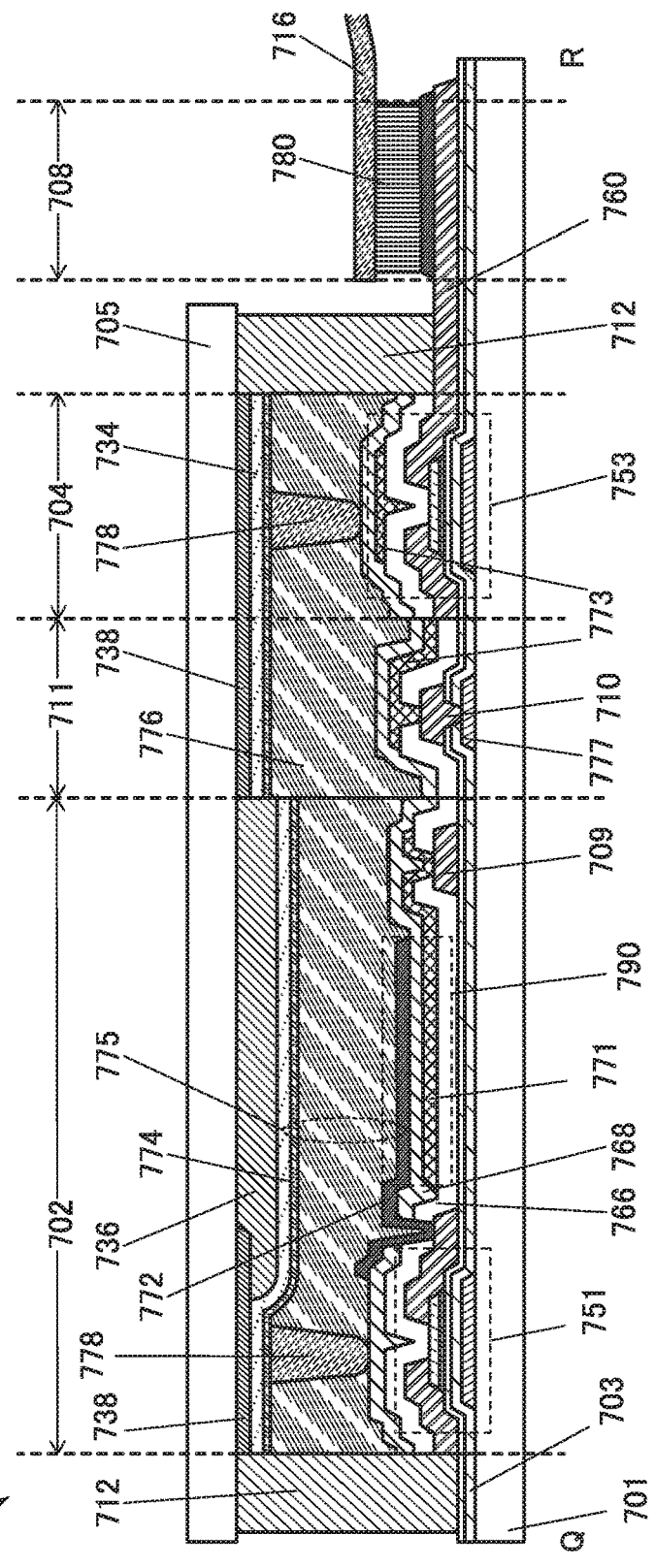
FIG. 13 is a cross-sectional view of one embodiment of the present invention.

Although the thickness of the channel formation region is thin in the transistors 750 and 752, without limitation thereon, a region of an oxide semiconductor film not covered with a conductive film might not be made thin. FIG. 13 illustrates an example of such a case. FIG. 13 illustrates transistors 751 and 753 whose channel formation regions have approximately uniform thickness. The structure in FIG. 13 is the same as that in FIG. 2 except for the thickness of the channel formation regions. Thus, detailed description thereof is omitted here.

Embodiment 2

An example of manufacturing steps of the transistor 750 illustrated in FIG. 2 is described below.

A transistor 100 having the same structure as the transistor 750 is described below. FIGS. 3A to 3C, FIGS. 4A to 4C, FIGS. 5A to 5C, FIGS. 6A and 6B, and FIG. 7A are cross-sectional views illustrating manufacturing steps of the transistor 100 illustrated in FIG. 7B.

First, a conductive film is formed over a substrate 102 and processed through a lithography process and an etching process, whereby a conductive film 104 functioning as a gate electrode is formed. Then, insulating films 106 and 107 functioning as a gate insulating film are formed over the conductive film 104 (see FIG. 3A).

There is no particular limitation on the property of a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 102. In the case where a glass substrate is used as the substrate 102, a glass substrate having any of the following sizes can be used: the 6th generation, the 7th generation, the 8th generation, the 9th generation, and the 10th generation. Using such a large-area substrate is preferable because the manufacturing cost can be reduced, Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

In this embodiment, a glass substrate is used as the substrate 102, and as the conductive film 104 functioning as the gate electrode, a 100-nm-thick tungsten film is formed by a sputtering method. A 400-nm-thick silicon nitride film as the insulating film 106 and a 50-nm-thick silicon oxynitride film as an insulating film 107 are formed by a plasma enhanced chemical vapor deposition (PECVD) method.

As each of the insulating films 106 and 107 functioning as a gate insulating film of the transistor 100, an insulating layer including at least one of the following films formed by a PECVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used as the insulating film 107, the following effect is attained. Hafnium oxide has a higher dielectric constant than silicon oxide and silicon oxynitride. Therefore, the insulating layer 160 using hafnium oxide can have larger thickness than the insulating layer 160 using silicon oxide, so that leakage current due to tunnel current can be reduced. That is, it is possible to provide a transistor with a small off-state current. Moreover, hafnium oxide with a crystalline structure has higher dielectric constant than hafnium oxide with an amorphous structure. Therefore, it is preferable to use hafnium oxide with a crystalline structure in order to provide a transistor with a small off-state current. Examples of the crystalline structure include a monoclinic crystal structure and a cubic crystal structure. Note that one embodiment of the present invention is not limited thereto.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the condition where silane at a flow rate of 200 sccm, nitrogen at a flow rate of 2000 sccm, and an ammonia gas at a flow rate of 2000 sccm are supplied as a source gas to the reaction chamber of the PECVD apparatus; the pressure in the reaction chamber is controlled to 100 Pa, and a power of 2000 W is supplied using a 27.12 MHz high-frequency power source.

The third silicon nitride film can be formed to have a thickness of 50 nm under the condition where silane at a flow rate of 200 sccm and nitrogen at a flow rate of 5000 sccm are supplied as a source gas to the reaction chamber of the PECVD apparatus; the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can each be formed at a substrate temperature of 350° C. or lower.

When the insulating film 106 has the three-layer stacked-layer structure of silicon nitride films, for example, in the case where a conductive film including Cu is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film including oxygen to improve characteristics of an interface with the oxide semiconductor film 108 (specifically the first oxide semiconductor film 108a) formed later.

Next, an oxide semiconductor film 109 is formed over the insulating film 107 at a first temperature. The oxide semiconductor film 109 is formed in such a manner that a first oxide semiconductor film 109a is formed first and then a second oxide semiconductor film 109b is formed (see FIG. 3B).

The oxide semiconductor film 109 can be formed using the materials described above. In the case where the oxide semiconductor film 109 includes In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. In the case where the oxide semiconductor film 109 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 109 having crystallinity. Note that the atomic ratios of metal elements in the formed oxide semiconductor film 109 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 109 may be 4:2:3 or in the vicinity of 4:2:3.

The first temperature for forming the oxide semiconductor film 109 is higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. The oxide semiconductor film 109 is formed while heat treatment is performed, so that the crystallinity of the oxide semiconductor film 109 can be improved. When a large glass substrate (e.g., substrates of 6th to 10th generations) is used as the substrate 102, the substrate 102 might be distorted in the case where the first temperature is higher than or equal to 150° C. and lower than 340° C. Thus, when a large glass substrate is used, distortion of the glass substrate can be suppressed by setting the first temperature higher than or equal to 100° C. and lower than 150° C.

The substrate temperature for forming the first oxide semiconductor film 109a and that for forming the second oxide semiconductor film 109b may be the same or different from each other. Note that the substrate temperature for forming the first oxide semiconductor film 109a and that for forming the second oxide semiconductor film 109b are preferably the same because manufacturing cost can be reduced.

In this embodiment, the first oxide semiconductor film 109a is formed by a sputtering method using an In—Ga—Zn metal oxide target (having an atomic ratio of In:Ga:Zn=4:2:4.1), and then the second oxide semiconductor film 109b is successively formed in a vacuum by a sputtering method using an In—Ga—Zn metal oxide target (having an atomic ratio of In:Ga:Zn=1:1:1.2). The first oxide semiconductor film 109a and the second oxide semiconductor film 109b are formed at a substrate temperature of 170° C.

In the case where the oxide semiconductor film 109 is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture and the like into the oxide semiconductor film 109 can be minimized.

When the oxide semiconductor film 109 is formed by a sputtering method, each chamber of a sputtering apparatus is preferably evacuated to a high vacuum (to the degree of approximately $5\times10^{-7}$ Pa to $1\times10^{-4}$ Pa) by an adsorption vacuum pump such as a cryopump so that water and the like acting as impurities for the oxide semiconductor film 109 are removed as much as possible. Alternatively, a turbo molecular pump and a cold trap are preferably combined so as to prevent a backflow of a gas, especially a gas containing carbon or hydrogen from an exhaust system to the inside of the chamber.

Next, the oxide semiconductor film 109 is processed to form an island-shaped oxide semiconductor film 108. Note that the first oxide semiconductor film 109a becomes the first island-shaped oxide semiconductor film 108a and the second oxide semiconductor film 109b becomes the second oxide semiconductor film 108b (see FIG. 3C).

The first oxide semiconductor film 108a can be formed using the sputtering target having an atomic ratio of InM:Zn=2:1:3, In:M:Zn=3:1:2, or In:M:Zn=4:2:4.1. It is preferable that the first oxide semiconductor film 108a have an atomic ratio of In:M:Zn=4:$\alpha1$($1.5 \leq \alpha1 \leq 2.5$):$\alpha2$ ($2.5 \leq \alpha2 \leq 3.5$).

The second oxide semiconductor film 108b can be formed using the sputtering target having an atomic ratio of In:M:Zn=1:1:1 or In:M:Zn=1:1:1.2. It is preferable that the second oxide semiconductor film 108b have an atomic ratio of In:M:Zn=1:$\beta1$($0.8 \leq \beta1 \leq 1.2$):$\beta2$($0.8 \leq \beta2 \leq 1.2$). Note that the atomic ratio of metal elements in the sputtering target used for forming the second oxide semiconductor film 108b does not necessarily satisfy In≥M or Zn≥M, and may satisfy In≥M and Zn<M.

Alternatively, the first oxide semiconductor film 108a can be formed using the sputtering target having an atomic ratio of In:M:Zn=1:3:2, In:M:Zn=1:3:4, In:M:Zn=1:3:6, or the like, for example.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the first oxide semiconductor film 108a, and an oxide semiconductor film having an energy gap more than or equal to 2.5 eV and less than or equal to 3.5 eV is preferably used as the second oxide semiconductor film 108b. Furthermore, the second oxide semiconductor film 108b preferably has a higher energy gap than that of the first oxide semiconductor film 108a.

Each thickness of the first oxide semiconductor film 108a and the second oxide semiconductor film 108b is more than or equal to 3 nm and less than or equal to 200 nm, preferably more than or equal to 3 nm and less than or equal to 100 nm, more preferably more than or equal to 3 nm and less than or equal to 50 nm.

An oxide semiconductor film with low carrier density is used as the first oxide semiconductor film 108a. For example, an oxide semiconductor film whose carrier density is lower than $8\times10^{11}$/cm$^3$, preferably lower than $1\times10^{11}$/cm$^3$, or further preferably lower than $1\times10^{10}$/cm$^3$, and greater than or equal to $1\times10^{-9}$/cm$^3$ is used as the first oxide semiconductor film 108a. An oxide semiconductor film with low carrier density is used as the second oxide semiconductor film 108b. For example, the carrier density of the second oxide semiconductor film 108b is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the first oxide semiconductor film 108a and the second oxide semiconductor film 108b be set to be appropriate.

Note that it is preferable to use, as the first oxide semiconductor film 108a and the second oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, the highly purified intrinsic or substantially highly purified intrinsic oxide semiconductor film has an extremely small off-state current; even when an element has a channel width W of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

Figure 4A:
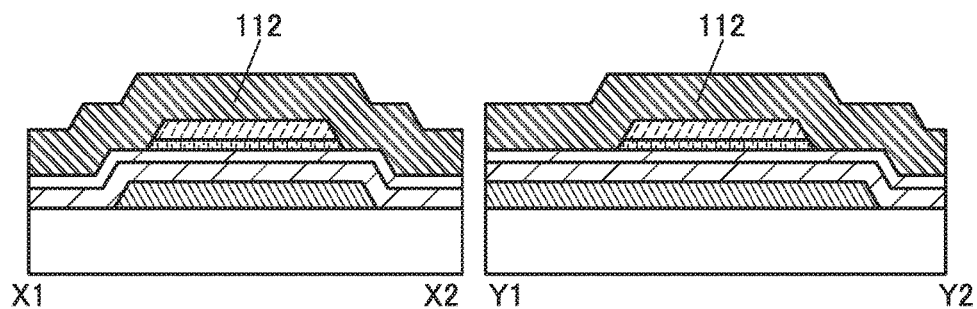
FIGS. 4A to 4C are cross-sectional views illustrating an example of the manufacturing process of a semiconductor device.

After that, heat treatment at a temperature higher than the first temperature is not performed, and a conductive film 112 to be the source electrode and the drain electrode is formed over the insulating film 107 and the oxide semiconductor film 108 by a sputtering method (see FIG. 4A).

The conductive film 104 functioning as a gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, each of the conductive films 104, 112a, and 112b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

In this embodiment, the conductive film 112 is formed of a 400-nm-thick aluminum film is stacked over a 50-nm-thick tungsten film by a sputtering method. Although the conductive film 112 has a two-layer structure in this embodiment, one embodiment of the present invention is not limited thereto. For example, the conductive film 112 may have a three-layer structure in which a 400-nm-thick aluminum film is stacked over a 50-nm-thick tungsten film, and a 100-nm-thick titanium film is stacked over the 400-nm-thick aluminum film.

Figure 4B:
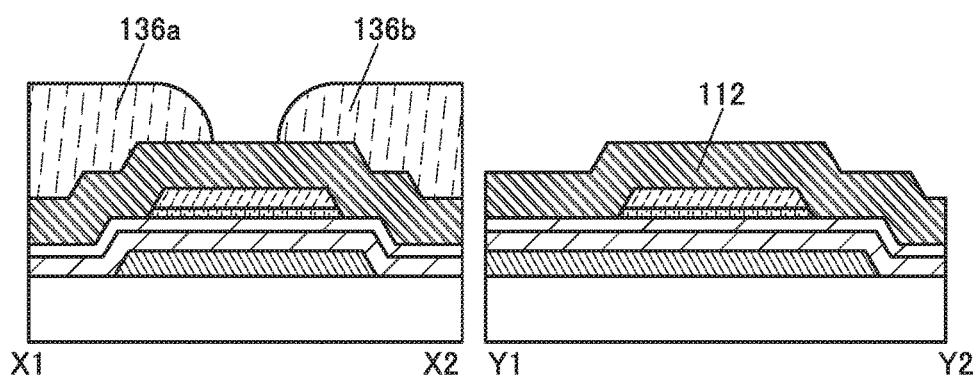

Next, masks 136a and 136b are formed in desired regions over the conductive film 112 (see FIG. 4B).

To form the masks 136a and 136b in this embodiment, a photosensitive resin film is applied to the conductive film 112 and is patterned by a lithography process.

Figure 4C:
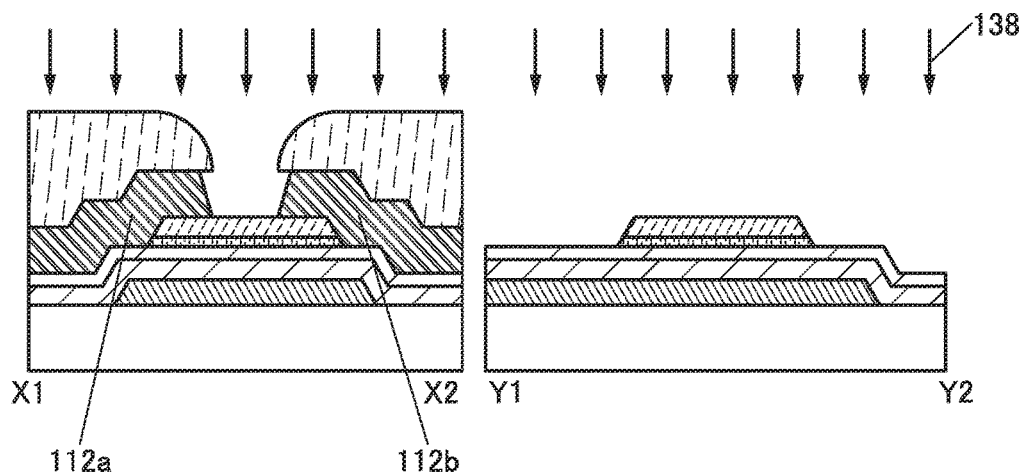

Then, an etchant 138 is applied from above the conductive film 112 and the masks 136a and 136b so that the conductive film 112 is selectively removed, whereby the conductive films 112a and 112b separated from each other are formed (see FIG. 4C).

In this embodiment, the conductive film 112 is processed with a dry etching apparatus. Note that a method of forming the conductive film 112 is not limited thereto. For example, a wet-etching apparatus and a chemical solution for the etchant 138 are used to process the conductive film 112. Note that a finer pattern can be formed when a dry etching apparatus is used for processing the conductive film 112 than when a wet etching apparatus is used. However, when a wet etching apparatus is used for processing the conductive film 112, manufacturing cost can be more reduced than when a dry etching apparatus is used.

Figure 5A:
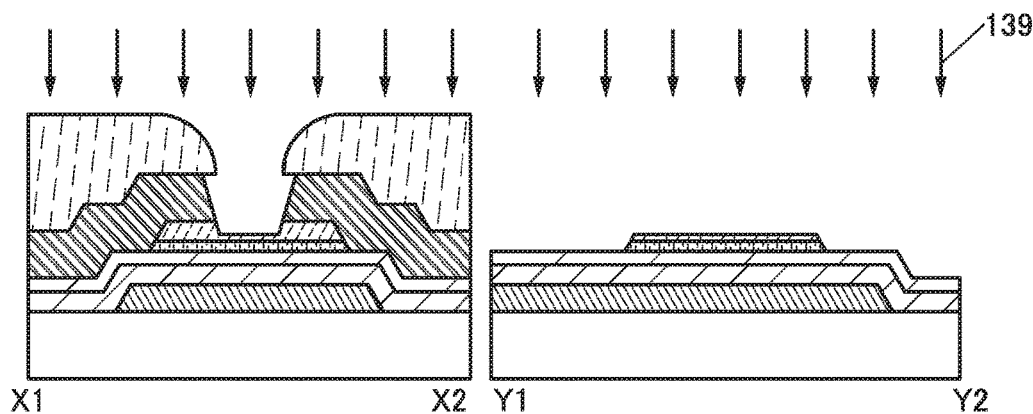
FIGS. 5A to 5C are cross-sectional views illustrating an example of the manufacturing process of a semiconductor device.
Figure 5B:
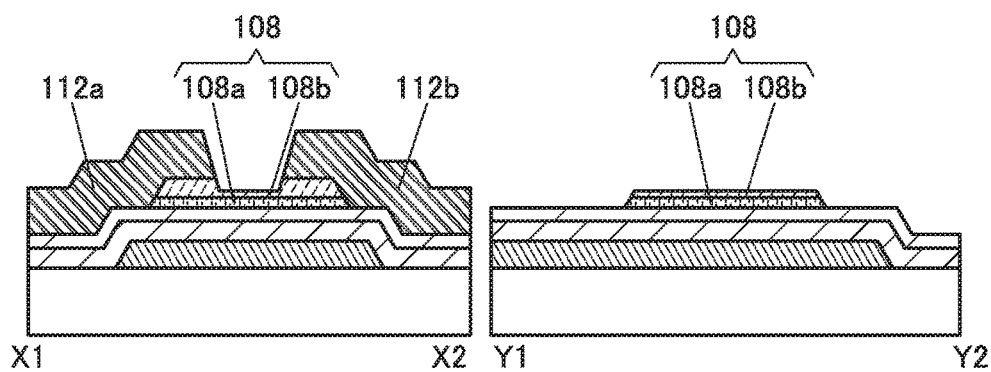

Then, an etchant 139 is applied from above the second oxide semiconductor film 108b, the conductive films 112a and 112b, and the masks 136a and 136b to clean a surface of the second oxide semiconductor film 108b (on the back channel side) (see FIG. 5A).

Through the formation and/or the cleaning of the conductive films 112a and 112b, a region of the second oxide semiconductor film 108b which is not covered with the conductive film 112a or 112b sometimes becomes thinner than the first oxide semiconductor film 108a.

However, through the formation and/or the cleaning of the conductive films 112a and 112b, the region of the second oxide semiconductor film 108b which is not covered with the conductive film 112a or 112b sometimes does not become thinner than the first oxide semiconductor film 108a.

Then the masks 136a and 136b are removed, and the conductive films 112a and 112b respectively serving as a source electrode and a drain electrode over the second oxide semiconductor film 108b are formed. The stacked-layer oxide semiconductor film 108 of the first oxide semiconductor film 108a and the second oxide semiconductor film 108b is obtained (see FIG. 5B).

A chemical solution may be applied over the second oxide semiconductor film 108b and the conductive films 112a and 112b to clean the surface of the second oxide semiconductor film 108b on the back-channel side. The cleaning may be performed, for example, using a chemical solution such as phosphoric acid. The cleaning using a chemical solution such as a phosphoric acid can remove impurities (e.g., elements included in the conductive films 112a and 112b) attached to the surface of the second oxide semiconductor film 108b. Note that the cleaning is not necessarily performed, and thus the cleaning may be unnecessary.

Through the formation and/or cleaning of the conductive films 112a and 112b, the second region whose thickness is smaller than that of the first oxide semiconductor film 108a is formed in the second oxide semiconductor film 108b.

Next, insulating films 114 and 116 are formed over the oxide semiconductor film 108 and the conductive films 112a and 112b.

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced and oxygen in the insulating films 114 and 116 can be moved to the oxide semiconductor film 108; accordingly, the amount of oxygen vacancy in the oxide semiconductor film 108 can be reduced.

For example, as the insulating film 114, a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 114 by a PECVD method under the conditions where the flow rate of the oxidizing gas is higher than 20 times and lower than 100 times, preferably higher than or equal to 40 times and lower than or equal to 80 times, that of the deposition gas; and the pressure in a process chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 350° C., the pressure is greater than or equal to 100 Pa and less than or equal to 250 Pa, preferably greater than or equal to 100 Pa and less than or equal to 200 Pa, with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, however, the bond between silicon and oxygen is weak, and part of oxygen in the film is released by heat treatment in a later step. Thus, it is possible to form an oxide insulating film which contains oxygen at a higher proportion than the stoichiometric composition and from which part of oxygen is released by heating.

The step of forming the insulating film 116 is performed using a PECVD apparatus at a temperature higher than or equal to 180° C. and lower than or equal to 350° C., and a temperature in a step of forming the insulating film 116 is preferably the highest in the manufacturing process of the transistor 100. For example, formation of the insulating film 116 at 350° C. enables the transistor 100 to be directly formed on a flexible substrate or the like.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating layer in which the amount of defects is small, i.e., the spin density of a signal which appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

After the insulating films 114 and 116 are formed (i.e., after the insulating film 116 is formed and before the first barrier film 131 is formed), heat treatment may be performed. The heat treatment can reduce nitrogen oxide included in the insulating films 114 and 116. By the heat treatment, part of oxygen included in the insulating films 114 and 116 can be moved to the oxide semiconductor film 108, so that the amount of oxygen vacancy included in the oxide semiconductor film 108 can be reduced.

When heat treatment is performed, the temperature of the heat treatment on the insulating films 114 and 116 is typically up to 400° C., preferably lower than 375° C., further preferably higher than or equal to 150° C. and lower than 360° C., still further preferably higher than or equal to 150° C. and lower than or equal to 350° C. The heat treatment may be performed under an atmosphere of nitrogen, oxygen, ultra-dry air (air in which water content is 20 ppm or less, preferably 1 ppm or less, more preferably 10 ppb or less), or a rare gas (e.g., argon or helium). Note that an electric furnace, an RTA apparatus, or the like can be used for the heat treatment, in which it is preferable that hydrogen, water, and the like not be contained in the nitrogen, oxygen, ultra-dry air, or rare gas.

Note that the temperature at the formation step of the insulating film 116 is the highest of temperatures in the formation process of the transistor 100, and heat treatment at temperatures equivalent to the temperature for forming the insulating film 116 may be performed in other steps.

Figure 5C:
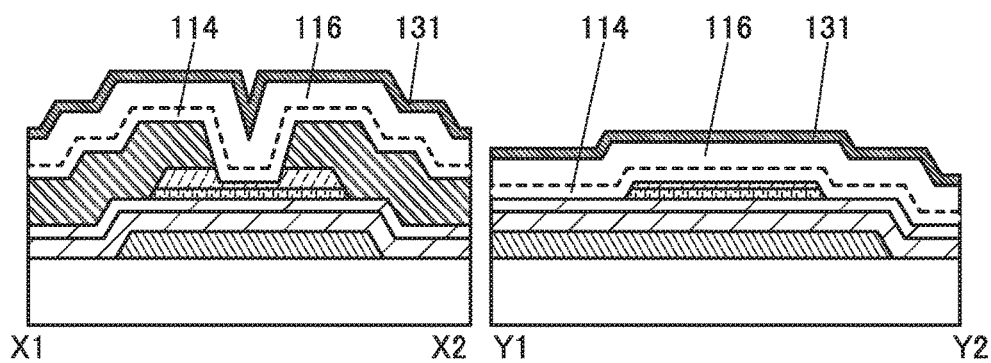

Next, the first barrier film 131 is formed over the insulating film 116 (see FIG. 5C).

The first barrier film 131 contains oxygen and metal (at least one of indium, gallium, zinc, titanium, aluminum, tungsten, tantalum, and molybdenum).

The first barrier film 131 can be formed by a sputtering method. When the first barrier film 131 is thin, it is sometimes difficult to inhibit release of oxygen from the insulating film 116 to the outside. In contrast, when the first barrier film 131 is thick, oxygen cannot be favorably added to the insulating film 116 in some cases. Therefore, the thickness of the first barrier film 131 is preferably greater than or equal to 1 nm and less than or equal to 20 nm, or greater than or equal to 2 nm and less than or equal to 10 nm. The first barrier film 131 can be formed using, for example, a tantalum oxynitride film, a titanium oxide film, an indium tin oxide (hereinafter also referred to as ITO) film, an aluminum oxide film, or an oxide semiconductor film (e.g., an IGZO film having an atomic ratio of In:Ga:Zn=1:4:5). In this embodiment, a 5-nm-thick indium tin oxide doped with silicon oxide (hereinafter referred to as ITSO) is used for the first barrier film 131.

Figure 6A:
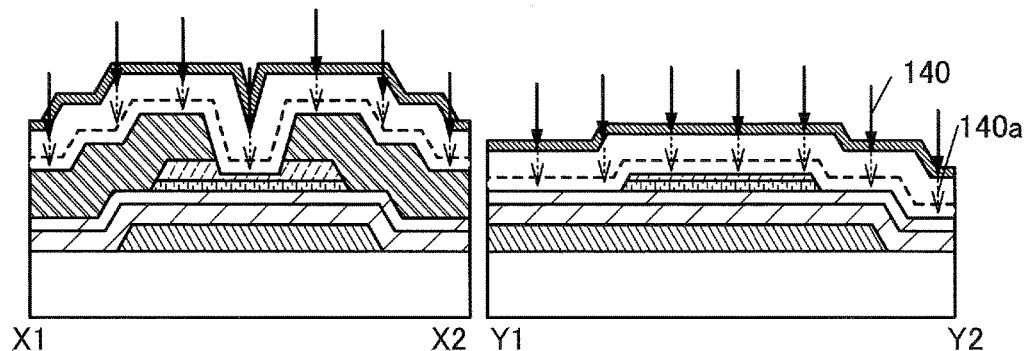
FIGS. 6A and 6B are cross-sectional views illustrating an example of the manufacturing process of a semiconductor device.

Next, oxygen 140 is added to the insulating films 114 and 116 and the oxide semiconductor film 108 through the first barrier film 131 (see FIG. 6A). Note that in FIG. 6A, oxygen added within the insulating films 114 and 116 is schematically shown as oxygen 140a.

As a method for adding the oxygen 140 to the insulating films 114 and 116 and the oxide semiconductor film 108 through the first barrier film 131, an ion doping method, an ion implantation method, plasma treatment, or the like is given. By the bias application to the substrate side when the oxygen 140 is added, the oxygen 140 can be effectively added to the insulating films 114 and 116 and the oxide semiconductor film 108. As the bias, for example, power density can be greater than or equal to 1 W/cm$^2$ and less than or equal to 5 W/cm$^2$. When the first barrier film 131 is provided over the insulating film 116 and then oxygen is added, the first barrier film 131 functions as a protective film for inhibiting release of oxygen from the insulating film 116. Thus, a larger amount of oxygen can be added to the insulating films 114 and 116 and the oxide semiconductor film 108.

When aluminum oxide, hafnium oxide, an IGZO film or yttrium oxide is deposited as the first barrier film 131 by a sputtering method, a sputtering gas preferably contains at least oxygen. In some cases, oxygen for the sputtering gas for forming the first barrier film 131 becomes oxygen radicals in plasma, and the oxygen and/or the oxygen radicals can be added to the insulating film 116. In that case, the step of adding the oxygen 140 illustrated in FIG. 6A can be skipped. That is, the step of forming the first barrier film 131 can double as oxygen adding treatment. The first barrier film 131 has a function of adding oxygen during its formation (in particular, at the initial stage of deposition), whereas it has a function of blocking oxygen after its formation.

Figure 6B:
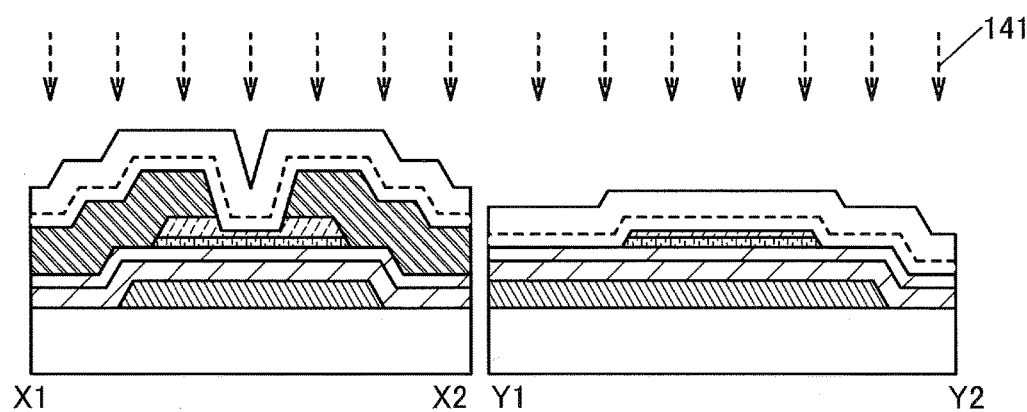

The first barrier film 131 is removed using an etchant 141 (see FIG. 6B).

For example, dry etching, wet etching, or a combination thereof can be used for removing the first barrier film 131. Note that the etchant 141 is an etching gas in the case of dry etching and is a chemical solution in the case of wet etching. In this embodiment, wet etching is used for removing the first barrier film 131.

Figure 7A:
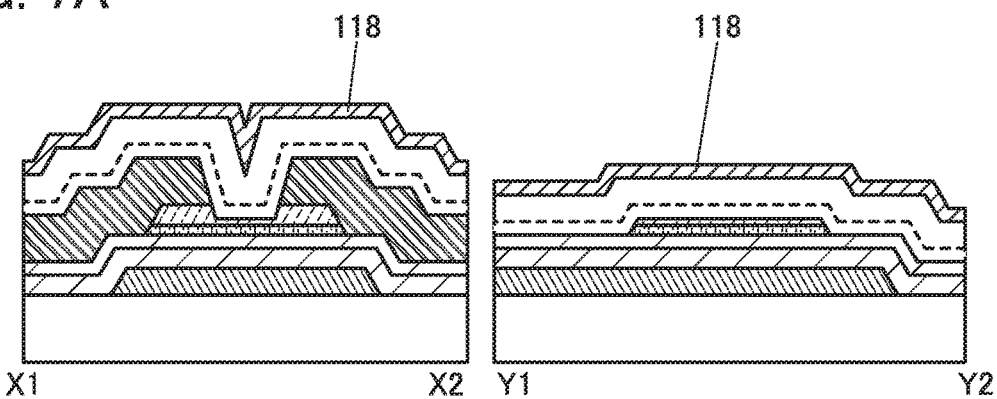
FIGS. 7A and 7B are cross-sectional views of an example of a manufacturing process of a semiconductor device.

Next, an insulating film 118 is formed over the insulating film 116 (see FIG. 7A).

Note that heat treatment may be performed before or after the formation of the insulating film 118, so that excess oxygen included in the insulating films 114 and 116 can diffuse into the oxide semiconductor film 108 to fill oxygen vacancy in the oxide semiconductor film 108. Alternatively, the insulating film 118 may be deposited by heating, so that excess oxygen included in the insulating films 114 and 116 can diffuse into the oxide semiconductor film 108 to fill oxygen vacancy in the oxide semiconductor film 108.

In the case of using a PECVD method, the substrate temperature is preferably set to higher than or equal to 180° C. and lower than or equal to 350° C. because a dense insulating film 118 can be formed.

For example, in the case where a silicon nitride film is formed by a PECVD method as the insulating film 118, a deposition gas containing silicon, nitrogen, and ammonia are preferably used as a source gas. A small amount of ammonia compared to the amount of nitrogen is used, whereby ammonia is dissociated in the plasma and activated species are generated. The activated species break a bond between silicon and hydrogen that are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Heat treatment (at up to 400° C.) may be performed after the formation of the insulating film 118 functioning as a second barrier film. Through the heat treatment before the insulating film 118 is formed or the heat treatment after the insulating film 118 is formed, excess oxygen or oxygen radicals in the insulating film 116 can be diffused into the oxide semiconductor film 108 to fill oxygen vacancies in the oxide semiconductor film 108. Alternatively, the insulating film 118 may be formed while heat treatment is performed, whereby excess oxygen or oxygen radicals in the insulating film 116 can be diffused into the oxide semiconductor film 108 to fill oxygen vacancies in the oxide semiconductor film 108.

Figure 7B:
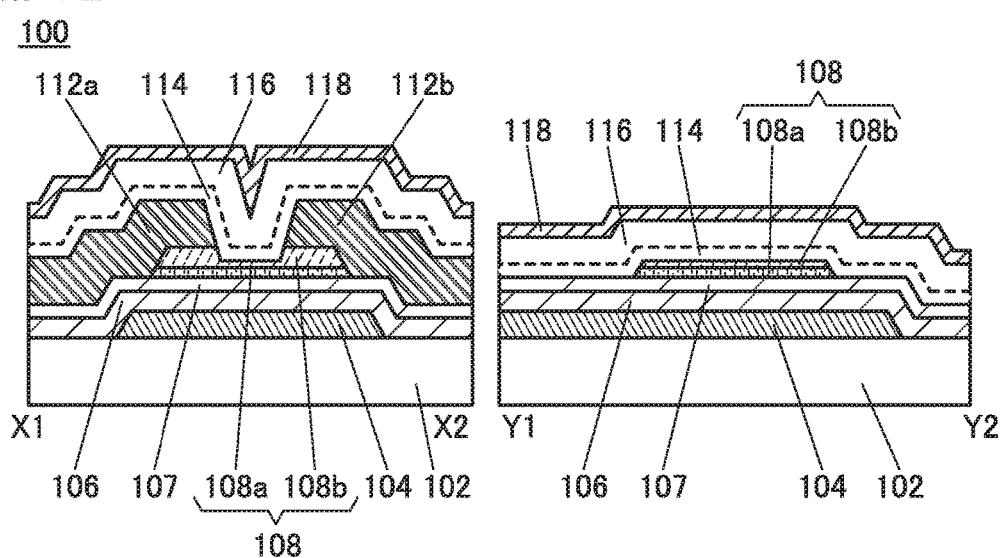

Through the above process, the transistor 100 illustrated in FIG. 7B can be manufactured. FIG. 7B shows a cross-sectional view taken along dashed dotted line X1-X2 in FIG. 7C and a cross-sectional view taken along dashed dotted line Y1-Y2 in FIG. 7C.

Figure 7C:
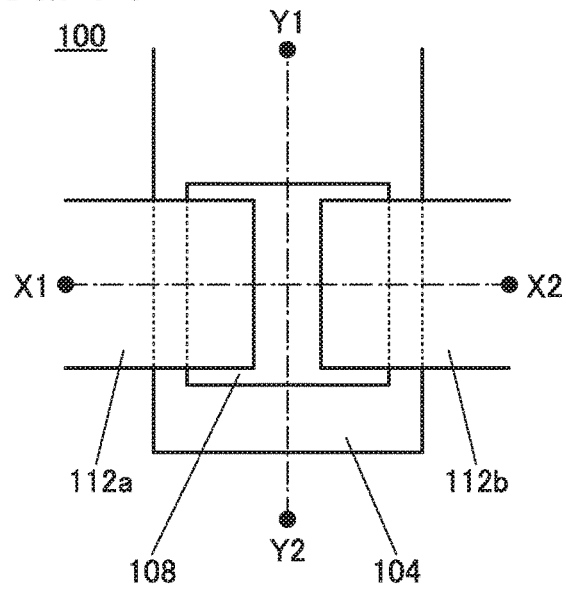
FIG. 7C is a top view of one embodiment of the semiconductor device.

Note that in FIG. 7C, some components of the transistor 100 (e.g., an insulating film serving as a gate insulating film) are not illustrated to avoid complexity. Furthermore, the direction of the dashed dotted line X1-X2 may be called a channel length direction, and the direction of the dashed dotted line Y1-Y2 may be called a channel width direction. In a manner similar to that of FIG. 7C, some components are not illustrated in some cases in top views of transistors described below.

The oxide semiconductor film in the transistor 100 includes a stacked-layer structure. Here, a band diagram including the oxide semiconductor film 108 and insulating films in contact with the oxide semiconductor film 108 is described with reference to FIG. 10.

Figure 10:
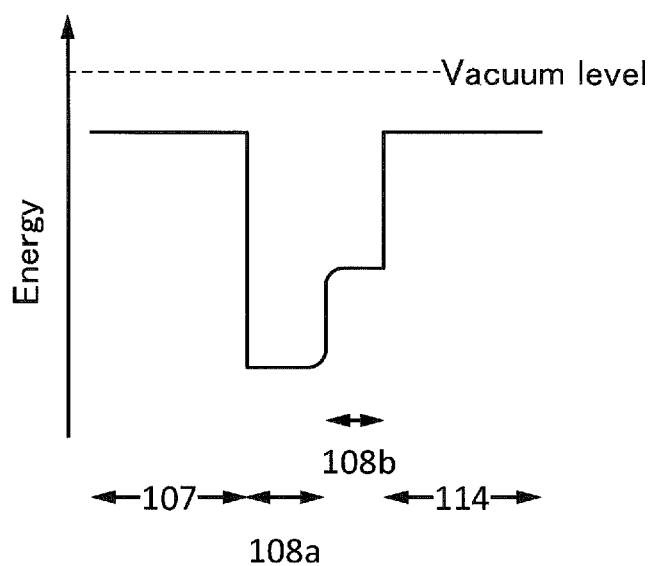
FIG. 10 is a band diagram.

FIG. 10 shows an example of a band structure in the thickness direction of a stack including the insulating film 107, the first oxide semiconductor film 108a, the second oxide semiconductor film 108b, and the insulating film 114. For easy understanding, energy level of the conduction band minimum ($E_c$) of each of the insulating film 107, the first oxide semiconductor film 108a, the second oxide semiconductor film 108b, and the insulating film 114 is shown in the band structure.

In the band diagram of FIG. 10, a silicon oxide film is used as each of the insulating films 107 and 114, an oxide semiconductor film formed using a metal oxide target having an atomic ratio of metal elements of In:Ga:Zn=4:2:4.1 is used as the first oxide semiconductor film 108a, and a metal oxide film formed using a metal oxide target having an atomic ratio of metal elements of In:Ga:Zn=1:1:1.2 is used as the second oxide semiconductor film 108b.

As illustrated in FIG. 10, the energy level of the conduction band minimum gradually varies between the first oxide semiconductor film 108a and the second oxide semiconductor film 108b. In other words, the energy level of the conduction band minimum is continuously varied or continuously connected. To obtain such a band structure, there exists no impurity, which forms a defect state such as a trap center or a recombination center, at the interface between the first oxide semiconductor film 108a and the second oxide semiconductor film 108b.

To form a continuous junction between the first oxide semiconductor film 108a and the second oxide semiconductor film 108b, the films are formed successively without exposure to the air by using a multi-chamber deposition apparatus (sputtering apparatus) provided with a load lock chamber.

With the band structure of FIG. 10, the first oxide semiconductor film 108a serves as a well, and a channel region is formed in the first oxide semiconductor film 108a in the transistor with the layered structure.

In the case where the second oxide semiconductor film 108b is not provided, trap states might be formed in the first oxide semiconductor film 108a. However, in the above layered structure, the trap states can be formed in the second oxide semiconductor film 108b. Thus, the trap states can be distanced away from the first oxide semiconductor film 108a.

In addition, the trap states might be more distant from the vacuum level than the energy level of the conduction band minimum ($E_c$) of the first oxide semiconductor film 108a functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the energy level of the trap states be closer to the vacuum level than the energy level of the conduction band minimum ($E_c$) of the first oxide semiconductor film 108a. Such a structure inhibits accumulation of electrons in the trap states. As a result, the on-state current and the field-effect mobility of the transistor can be increased.

In FIG. 10, the energy level of the conduction band minimum of the second oxide semiconductor film 108b is closer to the vacuum level than that of the first oxide semiconductor film 108a. Typically, a difference in energy level between the conduction band minimum of the first oxide semiconductor film 108a and the conduction band minimum of the second oxide semiconductor film 108b is 0.15 eV or more or 0.5 eV or more and 2 eV or less or 1 eV or less. That is, the difference between the electron affinity of the second oxide semiconductor film 108b and the electron affinity of the first oxide semiconductor film 108a is 0.15 eV or more or 0.5 eV or more and 2 eV or less or 1 eV or less.

In such a structure, the first oxide semiconductor film 108a serves as a main path of current and functions as a channel region. In addition, since the second oxide semiconductor film 108b includes one or more metal elements included in the first oxide semiconductor film 108a in which a channel region is formed, interface scattering is less likely to occur at the interface between the first oxide semiconductor film 108a and the second oxide semiconductor film 108b. Thus, the transistor can have high field-effect mobility because the movement of carriers is not hindered at the interface.

To prevent the second oxide semiconductor film 108b from functioning as part of a channel region, a material having sufficiently low conductivity is used for the second oxide semiconductor film 108b. Alternatively, a material which has a smaller electron affinity (a difference in energy level between the vacuum level and the conduction band minimum) than the first oxide semiconductor film 108a and has a difference in energy level in the conduction band minimum from the first oxide semiconductor film 108a (band offset) is used for the second oxide semiconductor film 108b. Furthermore, to inhibit generation of a difference between threshold voltages due to the value of the drain voltage, it is preferable to form the second oxide semiconductor film 108b using a material whose energy level of the conduction band minimum is closer to the vacuum level than that of the first oxide semiconductor film 108a. For example, a difference in energy level between the conduction band minimum of the second oxide semiconductor film 108b and the conduction band minimum of the first oxide semiconductor film 108a is preferably 0.2 eV or more, further preferably 0.5 eV or more.

It is preferable that the second oxide semiconductor film 108b not have a spinel crystal structure. This is because if the second oxide semiconductor film 108b has a spinel crystal structure, constituent elements of the conductive films 112a and 112b might be diffused into the first oxide semiconductor film 108a at the interface between the spinel crystal structure and another region. Note that the second oxide semiconductor film 108b is preferably a CAAC-OS, which is described later, in which case a higher blocking property against constituent elements of the conductive films 112a and 112b, for example, a copper element, is obtained.

The thickness of the second oxide semiconductor film 108b is large enough to inhibit diffusion of the constituent elements of the conductive films 112a and 112b into the second oxide semiconductor film 108b and small enough not to inhibit supply of oxygen from the insulating film 114 to the oxide semiconductor film 108b. For example, when the thickness of the second oxide semiconductor film 108b is greater than or equal to 10 nm, diffusion of the constituent elements of the conductive films 112a and 112b into the first oxide semiconductor film 108a can be inhibited. When the thickness of the second oxide semiconductor film 108b is less than or equal to 100 nm, oxygen can be effectively supplied from the insulating films 114 and 116 to the first oxide semiconductor film 108a. Note that there may be the case where the second oxide semiconductor film 108b is partly etched to have a smaller thickness than the above thickness through forming the conductive films 112a and 112b or cleaning after forming the conductive films 112a and 112b. For example, in the case where the thickness of the second oxide semiconductor film 108b is 10 nm, the thickness of the second oxide semiconductor film 108b in the region where the conductive films 112a and 112b are not provided might be greater than or equal to 3 nm and less than 10 nm.

An example of manufacturing steps of the transistor 752 illustrated in FIG. 2 is described below. In the transistor 752, a gate electrode is provided over and under the stack of oxide semiconductor layers.

A transistor 170 having the same structure as the transistor 752 is described below. FIGS. 9A to 9C are cross-sectional views illustrating manufacturing steps of the transistor 170 illustrated in FIG. 8B. Since steps for manufacturing the transistor 170 is almost the same as that for manufacturing the transistor 100 except that the step of providing a second gate electrode over the gate electrode of the transistor 100 is added, the detailed description thereof is omitted.

The transistor 170 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the conductive film 112a functioning as a source electrode electrically connected to the oxide semiconductor film 108, the conductive film 112b functioning as a drain electrode electrically connected to the oxide semiconductor film 108, the insulating film 114 over the oxide semiconductor film 108, the insulating film 116 over the insulating film 114, a conductive film 120a over the insulating film 116, a conductive film 120b over the insulating film 116, an insulating film 118 over the conductive film 120a. The insulating films 114 and 116 function as second gate insulating films of the transistor 170. The conductive film 120a is electrically connected to the conductive film 112b through an opening 142c provided in the insulating films 114 and 116. The conductive film 120a can be formed in the same step as a pixel electrode used in a display device, for example. The conductive film 120b in the transistor 170 functions as a second gate electrode (also referred to as a back gate electrode).

Figure 8A:
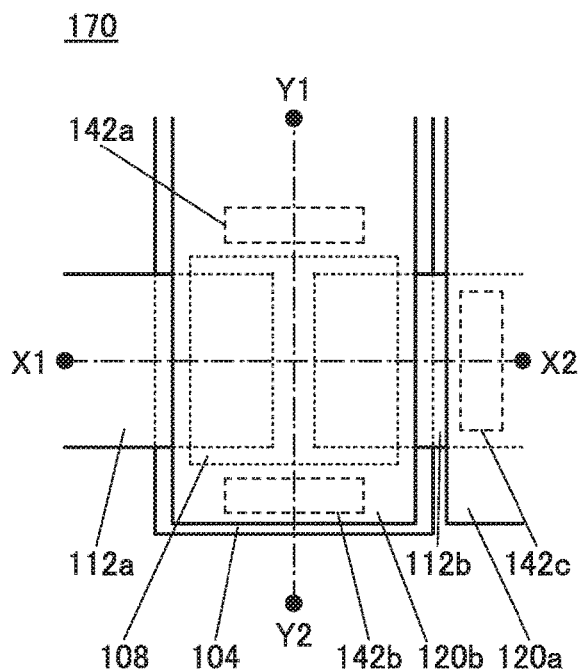
FIGS. 8A and 8B are a top view and cross-sectional views illustrating one embodiment of a semiconductor device.
Figure 8B:
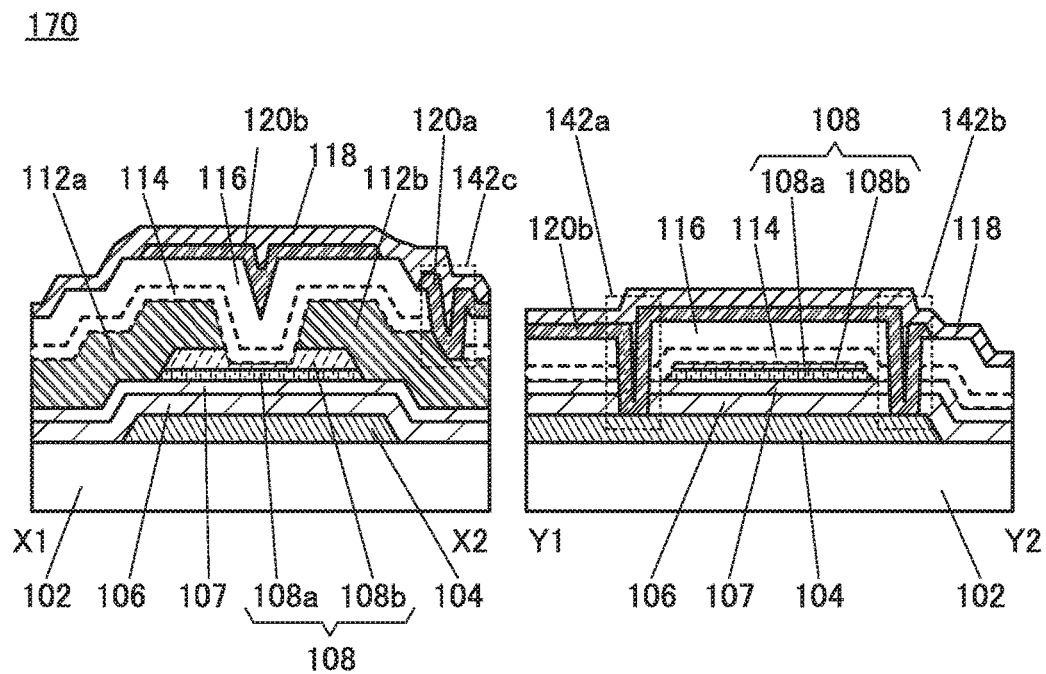
Figure 9A:
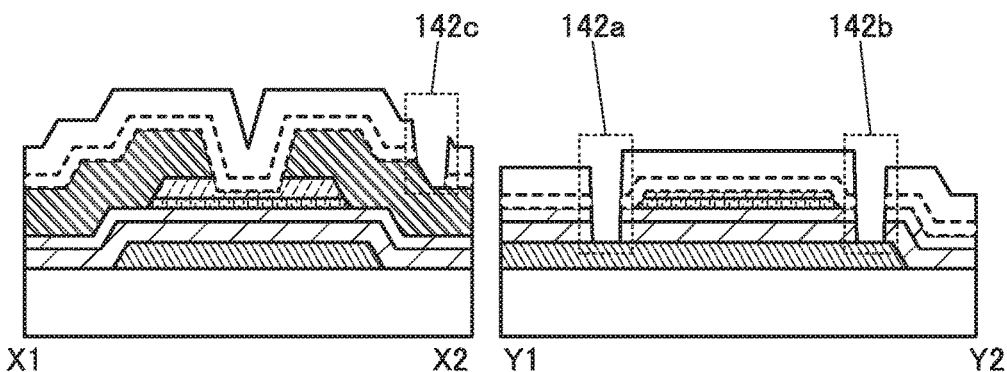
FIGS. 9A to 9C are cross-sectional views illustrating an example of a manufacturing process of a semiconductor device.
Figure 9B:
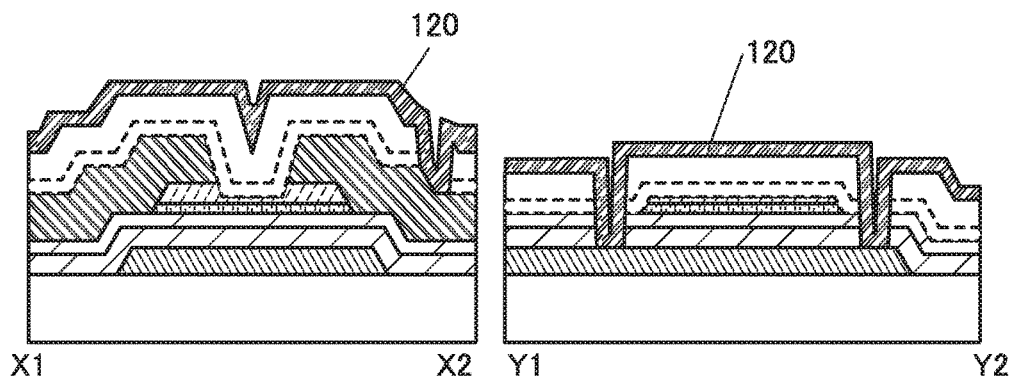
Figure 9C:
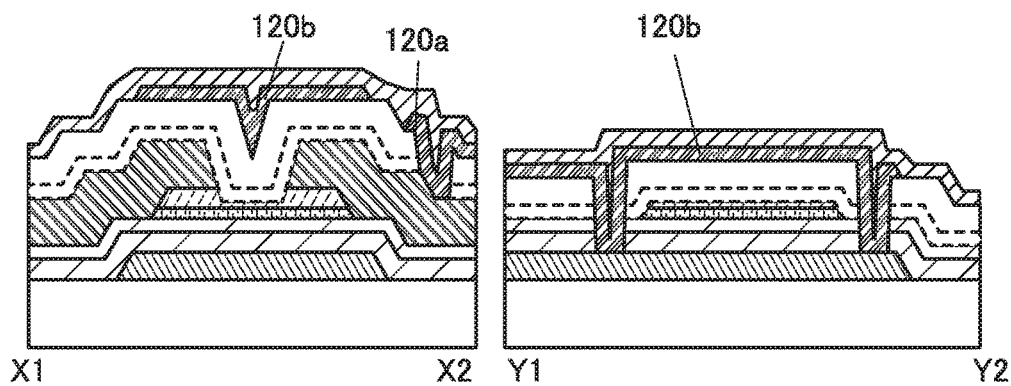

As illustrated in FIG. 8B, the conductive film 120b is connected to the conductive film 104 functioning as a first gate electrode through openings 142a and 142b provided in the insulating films 106, 107, 114 and 116. Accordingly, the conductive film 120b and the conductive film 104 are supplied with the same potential.

Note that although the structure in which the openings 142a and 142b are provided so that the conductive film 120b and the conductive film 104 are connected to each other is described in this embodiment, one embodiment of the present invention is not limited thereto. For example, a structure in which only one of the openings 142a and 142b is provided so that the conductive film 120b and the conductive film 104 are connected to each other, or a structure in which the openings 142a and 142b are not provided and the conductive film 120b and the conductive film 104 are not connected to each other may be employed. Note that in the case where the conductive film 120b and the conductive film 104 are not connected to each other, it is possible to apply different potentials to the conductive film 120b and the conductive film 104.

As illustrated in FIG. 8B, the oxide semiconductor film 108 is positioned to face each of the conductive film 104 functioning as a first gate electrode and the conductive film 120b functioning as a second gate electrode, and is sandwiched between the two conductive films functioning as gate electrodes. The lengths in the channel length direction and the channel width direction of the conductive film 120b functioning as a second gate electrode are longer than those in the channel length direction and the channel width direction of the oxide semiconductor film 108. The whole oxide semiconductor film 108 is covered with the conductive film 120b with the insulating films 114 and 116 positioned therebetween. Since the conductive film 120b functioning as a second gate electrode is connected to the conductive film 104 functioning as the first gate electrode through the openings 142a and 142b provided in the insulating films 106, 107, 114, and 116, a side surface of the oxide semiconductor film 108 in the channel width direction faces the conductive film 120b functioning as a second gate electrode with the insulating films 114 and 116 positioned therebetween.

In other words, in the channel width direction of the transistor 170, the conductive film 104 functioning as a first gate electrode and the conductive film 120b functioning as a second gate electrode are connected to each other through the openings provided in the insulating films 106 and 107 functioning as first gate insulating films, and the insulating films 114 and 116 functioning as second gate insulating films; and the conductive film 104 and the conductive film 120b surround the oxide semiconductor film 108 with the insulating films 106 and 107 functioning as first gate insulating films, and the insulating films 114 and 116 functioning as second gate insulating films positioned therebetween.

With such a structure, the oxide semiconductor film 108 included in the transistor 170 can be electrically surrounded by electric fields of the conductive film 104 functioning as a first gate electrode and the conductive film 120b functioning as a second gate electrode. A device structure of a transistor, like that of the transistor 170, in which electric fields of a first gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor film 108 by the conductive film 104 functioning as a first gate electrode; therefore, the current drive capability of the transistor 170 can be improved and high on-state current characteristics can be obtained. Since the on-state current can be increased, it is possible to reduce the size of the transistor 170. In addition, since the transistor 170 has a structure in which the oxide semiconductor film 108 is surrounded by the conductive film 104 functioning as a first gate electrode and the conductive film 120b functioning as a second gate electrode, the mechanical strength of the transistor 170 can be increased.

Note that the other components of the transistor 170 are the same as those of the transistor 100 described above, and an effect similar to that of the transistor 100 can be obtained.

Next, a method for manufacturing the transistor 170 that is one embodiment of the present invention will be described with reference to FIGS. 9A to 9C. FIGS. 9A to 9C are cross-sectional views illustrating the method for manufacturing the semiconductor device.

First, steps similar to those in the manufacturing method of the transistor 100 described above are performed (the steps illustrated in FIGS. 3A to 3C, FIGS. 4A to 4C, FIGS. 5A to 5C, FIGS. 6A and 6B, and FIG. 7A).

Next, a mask is formed over the insulating film 116 through a lithography process, and the opening 142c is formed in a desired region in the insulating films 114 and 116. In addition, a mask is formed over the insulating film 116 through a lithography process, and the openings 142a and 142b are formed in desired regions in the insulating films 106, 107, 114, and 116. Note that the opening 142c reaches the conductive film 112b. The openings 142a and 142b reach the conductive film 104 (see FIG. 9A).

Note that the openings 142a and 142b and the opening 142c may be formed in the same step or may be formed by different steps. In the case where the openings 142a and 142b and the opening 142c are formed in the same step, for example, a gray-tone mask or a half-tone mask can be used. Moreover, the openings 142a and 142b may be formed in some steps. For example, the insulating films 106 and 107 are processed and then the insulating films 114 and 116 are processed.

Next, a conductive film 120 is formed over the insulating film 116 to cover the openings 142a, 142b, and 142c (see FIG. 9B).

For the conductive film 120, for example, a material containing one of indium (In), zinc (Zn), and tin (Sn) can be used. In particular, the conductive film 120 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin silicon oxide (ITSO). The conductive film 120 can be formed by a sputtering method, for example. In this embodiment, a 110-nm-thick ITSO film is formed by a sputtering method.

Next, a mask is formed over the conductive film 120 through a lithography process, and the conductive film 112 is processed into desired shapes to form the conductive films 120a and 120b.

To form the conductive films 120a and 120b, for example, a dry etching method, a wet etching method, or a combination of a dry etching method and a wet etching method is used. In this embodiment, a wet etching method is employed for processing the conductive film 120 into the conductive films 120a and 120b.

Next, the insulating film 118 covering the conductive films 120a and 120b is formed (see FIG. 9C).

Through the above process, the transistor 170 illustrated in FIGS. 8A and 8B can be manufactured.

The structures of the transistors of this embodiment can be freely combined with each other. For example, the transistor 100 shown in FIGS. 7A and 7B can be used as a transistor in a pixel portion of a display device, and the transistor 170 shown in FIGS. 8A and 8B can be used as a transistor in a gate driver of a display device.

The common electrode 771 in the pixel portion and the conductive film 120b (back gate electrode) of a transistor in the driver can be manufactured in the same process; thus, the manufacturing process can be shortened.

Embodiment 3

In this embodiment, the structure of an oxide semiconductor included in a semiconductor device of one embodiment of the present invention will be described in detail.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, even in the high-resolution TEM image, a boundary between the crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including $InGaZnO_4$ crystals is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Charges trapped by the carrier traps in the oxide semiconductor film take a long time to be released, and might behave like fixed charges. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part can be found in some cases. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm corresponds to the a-b plane of the $InGaZnO_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

It is known that the off-state current of a transistor in which a channel is formed in an oxide semiconductor is extremely small. Note that an off-state current refers to a drain current of a transistor that is off (a drain current when the gate voltage of the transistor is sufficiently lower than the threshold voltage).

A transistor with an extremely small off-state current can be used for a display device.

For example, by using the transistor in a pixel circuit or the like in a display device, power consumption of the display device can be reduced in some cases. Furthermore, eye strain of a user of the display device might be reduced.

For example, in a conventional display device, the frequency of a rewriting operation (a so-called refresh operation) of pixels is more than or equal to 30 Hz (30 times a second), preferably more than or equal to 60 Hz (60 times a second) even in displaying a still image. Therefore, a reduction in power consumption of the conventional display device is difficult even in displaying a still image. Here, "displaying a still image" means that the same image is displayed for 1 second or longer or 5 seconds or longer.

That is, one of factors for increasing power consumption of the conventional display device is frequent rewriting operations of pixels even in displaying a still image. The reason why the conventional display device needs frequent rewriting operations of pixels even in displaying a still image is described below.

For example, in a liquid crystal display device, gray level is determined in accordance with a potential of a liquid crystal element. A capacitor for holding charge is connected to the liquid crystal element. Note that the capacitance of the capacitor includes parasitic capacitance.

In this manner, a capacitor is used for holding a potential which determines gray level in a liquid crystal display device. Therefore, one of the reasons why the conventional display device needs frequent rewriting operations of pixels is that leakage of charge held in the capacitor causes a change in gray level of the display device.

In addition, eye strain of a user of the conventional display device might be large. In the conventional display device, rewriting operation is performed frequently in order to suppress flicker of display. However, this is inadequate, and a distinct change in gray level occurred during rewriting operation was not negligible. The eye strain of a user may be caused by the flicker of display.

In view of the above, a display device of one embodiment of the present invention is described below.

In order to suppress eye strain of a user of a display device, reduction in flicker of display is needed. Change in gray level in one frame is reduced so that flicker of display can be reduced. Furthermore, at the time of displaying a still image, increasing one frame period (i.e., reducing the frequency of rewriting operations) can reduce power consumption. Therefore, this reveals that leakage of charge from a capacitor needs to be reduced in order to reduce the frequency of rewriting operations and change in gray level.

The capacitor is connected to a transistor for charge injection, for example, and the off-state current of the transistor leads to the leakage of charge from the capacitor. By replacing the transistor connected to the capacitor with a transistor having extremely small off-state current, the amount of charge leaking from the capacitor can be made extremely small in some cases.

In the case where the transistor with extremely small off-state current is used in a pixel circuit of a liquid crystal display device, charge hardly leaks from the capacitor through the transistor and mainly leaks through a liquid crystal element. Therefore, in the case where the liquid crystal display device displays an image including intermediate shades of grayscale, although it depends on the amount of leakage current of the liquid crystal element, change in gray level in one frame is less than one level in 256 levels when the frequency of rewriting operations of the liquid crystal display device is more than or equal to 10 Hz (10 times a second), more than or equal to 5 Hz (5 times a second), more than or equal to 1 Hz (1 time a second), or more than or equal to 0.2 Hz (one time 5 seconds).

As described above, the transistor with extremely small off-state current is used in a pixel circuit or the like in the display device, whereby the frequency of rewriting operations in displaying a still image can be reduced. Since the frequency of rewriting operations can be reduced in displaying a still image, the display device consumes less power than the conventional display device. In addition, since change in gray level in one frame can be reduced, the display device gives less flicker of display and less eye strain than the conventional display device.

In other words, in the liquid crystal display device of one embodiment of the present invention, when the frequency of performing rewriting operations is more than or equal to 10 Hz, 5 Hz, 1 Hz, or 0.2 Hz, the change in gray level in one frame is less than one level in 256 levels in the case of expressing an image including intermediate shades of gray scale, for example.

Embodiment 4

In this embodiment, a display device that includes a semiconductor device of one embodiment of the present invention will be described with reference to FIGS. 11A and 11B.

The display device illustrated in FIG. 11A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed, in which case the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 11A:
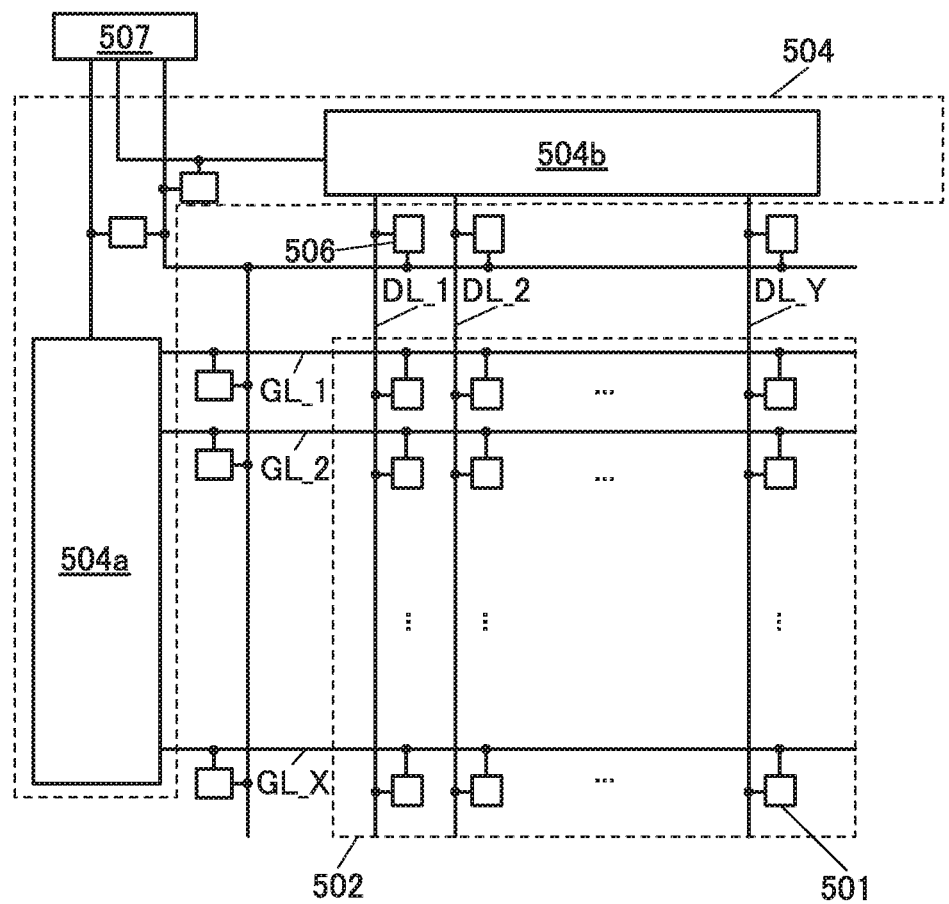
FIGS. 11A and 11B are a block diagram and a circuit diagram illustrating a display device.

The protection circuit 506 illustrated in FIG. 11A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 11A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 11A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 11B:
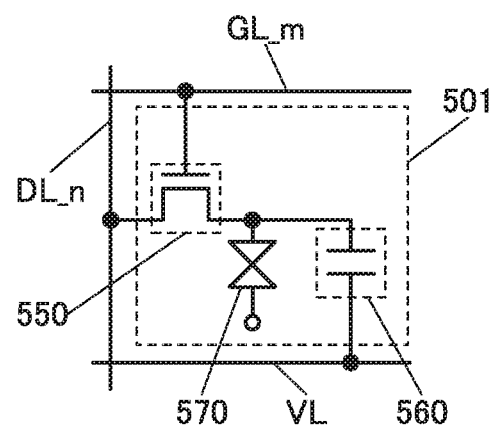

Each of the plurality of pixel circuits 501 in FIG. 11A can have the structure illustrated in FIG. 11B, for example.

The pixel circuit 501 illustrated in FIG. 11B includes a liquid crystal element 570, a transistor 550, and a capacitor 560. As the transistor 550, the transistor 100 described in the above embodiment can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like.

Other examples of the driving method of the display device include an electrically controlled birefringence (ECB) mode, a polymer-dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 11B, the pixel circuits 501 are sequentially selected row by row by the gate driver 504a illustrated in FIG. 11A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

The structure described in this embodiment can be used in appropriate combination with the structure described in any of the other embodiments.

Embodiment 5

In this embodiment, a display module and electronic devices that include a semiconductor device of one embodiment of the present invention will be described with reference to FIGS. 12A to 12C.

Examples of electronic devices to which one embodiment of the present invention can be applied include a television set (also referred to as a television or a television receiver), a monitor of a computer or the like, a camera such as a digital camera or a digital video camera, a digital photo frame, a mobile phone, a portable game machine, a portable information terminal, a music reproducing device, a game machine (e.g., a pachinko machine or a slot machine), and a game console. FIGS. 12A to 12C illustrate specific examples of these electronic devices.

Figure 12A:
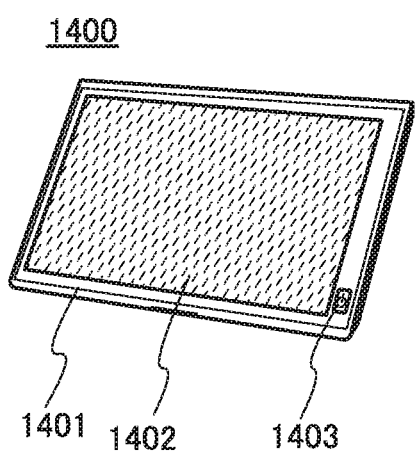
FIGS. 12A to 12C each illustrate an electronic device of one embodiment of the present invention.

FIG. 12A illustrates a portable information terminal 1400 including a display portion. The portable information terminal 1400 includes a display portion 1402 and an operation button 1403 which are incorporated in a housing 1401. The liquid crystal display device of one embodiment of the present invention can be used for the display portion 1402.

Figure 12B:
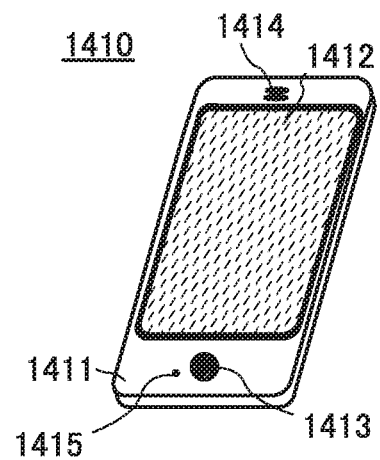

FIG. 12B illustrates a cellular phone 1410. The cellular phone 1410 includes a display portion 1412, an operation button 1413, a speaker 1414, and a microphone 1415 which are incorporated in a housing 1411. The liquid crystal display device of one embodiment of the present invention can be used for the display portion 1412.

Figure 12C:
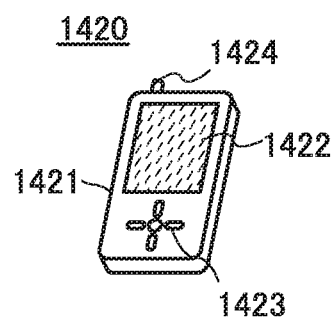

FIG. 12C illustrates a music reproducing device 1420. The music reproducing device 1420 includes a display portion 1422, an operation button 1423, and an antenna 1424 which are incorporated in a housing 1421. In addition, the antenna 1424 transmits and receives data via a wireless signal. The liquid crystal display device of one embodiment of the present invention can be used for the display portion 1422.

The display portions 1402, 1412, and 1422 each have a touch-input function. When a user touches a displayed button (not illustrated) which is displayed on the display portion 1402, 1412, or 1422 with his/her fingers or the like, the user can carry out operation on the screen and input of information.

When the liquid crystal display device described in the above embodiment is used for the display portions 1402, 1412, and 1422, the display quality of the display portions 1402, 1412, and 1422 can be improved.

This embodiment can be implemented in an appropriate combination with any of the structures described in the other embodiments.

Embodiment 6

In this embodiment, the significance of reducing frequency of the refresh operation (also referred to as refresh rate) described in Embodiment 3 will be explained. Low fresh rate can reduce both power consumption and eye strain.

The eye strain is divided into two categories: nerve strain and muscle strain. The nerve strain is caused by prolonged looking at light emitted from a liquid crystal display device or blinking images. This is because the brightness stimulates and fatigues a retina, optic nerves, and a brain. The muscle strain is caused by overuse of a ciliary muscle which works for adjusting the focus.

For the display of the conventional liquid crystal display device, image rewriting is performed 60 times per second. A prolonged looking at such a screen might stimulate a retina, optic nerves, and a brain of a user and lead to eye strain.

In one embodiment of the present invention, a pixel for displaying a still image at a frame frequency of less than or equal to 1 Hz is provided. The pixel includes a liquid crystal layer having a dielectric constant anisotropy of greater than or equal to 2 and less than or equal to 3.8. Thus, flickers due to a low refresh rate can be reduced.

In one embodiment of the present invention, a transistor including an oxide semiconductor (e.g., a transistor including a CAAC-OS) is used in a pixel portion of a liquid crystal display device. Since the transistor has an extremely small off-state current, the luminance of the liquid crystal display device can be kept even when the frame frequency is decreased.

Thus, for example, the number of times of image writing can be reduced to once every five seconds. The same image can be displayed for a long time as much as possible and flickers on a screen perceived by a user can be reduced. Therefore, stimuli to a retina, optic nerves, and a brain of a user are reduced, so that the strain is reduced.

In the case where the size of one pixel is large (e.g., the resolution is less than 150 ppi), a blurred character is displayed by a liquid crystal display device. When users look at the blurred character displayed on the liquid crystal display device for a long time, their ciliary muscles keep working to adjust the focus in a state where adjusting the focus is difficult, which might lead to eye strain.

In contrast, in the liquid crystal display device of one embodiment of the present invention, the size of one pixel is small and thus high resolution display is performed, so that precise and smooth display can be achieved. The precise and smooth display enables ciliary muscles to adjust the focus more easily, and reduces muscle strain of users.

High-speed image switching causes eye strain of users in some cases. For example, moving image display for which images are switched at an extremely high speed and the case of switching between different still images correspond to the high-speed image switching.

When images are switched for displaying different images, it is preferable that the images be switched gradually (silently) and naturally, not instantaneously.

For example, when a first image is changed to a second image that is different from the first image, it is preferable to interpose a fade-out image of the first image and/or a fade-in image of the second image between the first image and the second image. Alternatively, an image obtained by overlapping the first image and the second image may be interposed so that the second image fades in at the same time when the first image fades out (this technique is also referred to as crossfading). Further alternatively, a moving image (also referred to as morphing) for displaying the process in which the first image gradually changes into the second image may be interposed.

Specifically, a first still image is displayed at a low refresh rate, followed by an image for image switching is displayed at a high refresh rate, and then a second still image is displayed at a low refresh rate.

Quantitative measurement of eye strain has been studied. For example, the critical flicker (fusion) frequency (CFF) is known as an index of measuring nerve strain; and the accommodation time and the accommodation near point are known as indexes of measuring muscle strain.

Examples of other methods for measuring eye strain include electroencephalography, thermography, measurement of the number of blinkings, measurement of tear volume, measurement of a pupil contractile response speed, and a questionnaire for surveying subjective symptoms.

One embodiment of the present invention can provide an eye-friendly liquid crystal display device.

This embodiment can be implemented in an appropriate combination with any of the structures described in the other embodiments.

Embodiment 7

In this embodiment, an example that is partly different from the structure of FIG. 2 shown in Embodiment 1 will be described with reference to FIG. 14. Note that the same reference numerals are used for the same portions as those in FIG. 2, and description of the portions with the same reference numerals is omitted here.

In this embodiment, an example of providing a planarization insulating film 770 over the transistor 750 is shown.

The planarization insulating film 770 can be formed using a heat-resistant organic material, such as a polyimide resin, an acrylic resin, a polyimide amide resin, a benzocyclobutene resin, a polyamide resin, and an epoxy resin. Note that the planarization insulating film 770 may be formed by stacking a plurality of insulating films formed using these materials.

The common electrode 771 is provided over the planarization insulating film 770, and an insulating film 792 is provided thereover. The conductive film 772 serving as a pixel electrode is formed over the insulating film 792. A capacitor is formed of the conductive film 772, the common electrode 771, and the insulating film 792 provided therebetween as a dielectric.

Figure 14:
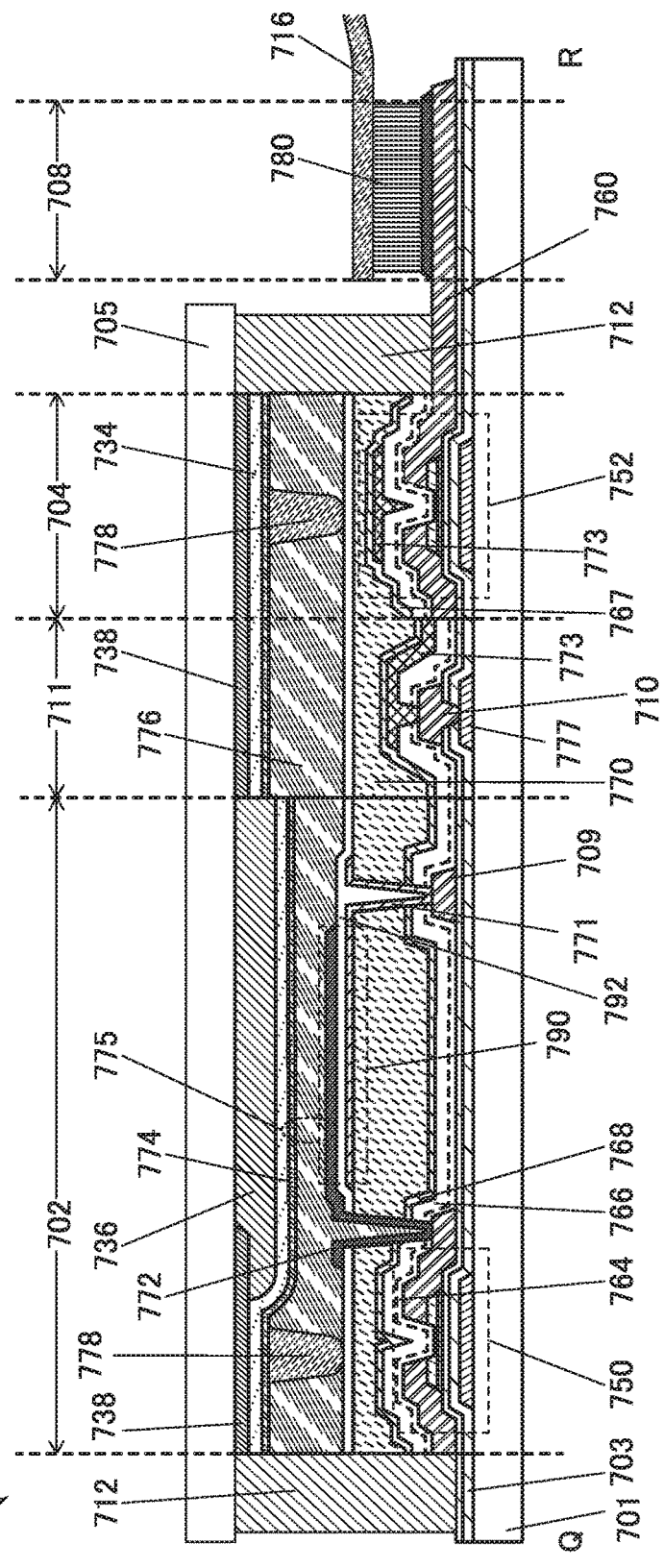
FIG. 14 is a cross-sectional view illustrating one embodiment of the invention.

In FIG. 14, the common electrode 771 is formed by a step different from that of the conductive film 773. Therefore, the number of the manufacturing steps is larger than that in the structure of FIG. 2. In addition, since the planarization insulating film 770 is formed, the number of the manufacturing steps is increased as compared with the structure of FIG. 2.

In the case where the thickness of the planarization insulating film 770 is reduced, a common electrode may be formed over an insulating film 766 in the same step as the conductive film 773 to form a capacitor with the conductive film 772 using the planarization insulating film 770 and the insulating film 768 as dielectrics. Note that an insulating film 766 is formed over the insulating film 764, the insulating film 768 is formed over the insulating film 766, and the planarization insulating film 770 is formed over the insulating film 768. In FIG. 14, an interface between the insulating film 764 and the insulating film 766 is shown with a dotted line. In some cases, it is not shown since the insulating film 764 and the insulating film 766 are only partly different in deposition conditions and are successively formed. In FIG. 14, the transistor 750 corresponds to the transistor 100 of FIG. 7B; an insulating film 703, the insulating film 764, the insulating film 766, and the insulating film 768 in FIG. 14 correspond to the insulating film 106, the insulating film 114, the insulating film 116, and the insulating film 118, respectively.

This embodiment can be implemented in an appropriate combination with any of the structures described in the other embodiments.

Embodiment 8

Figure 15:
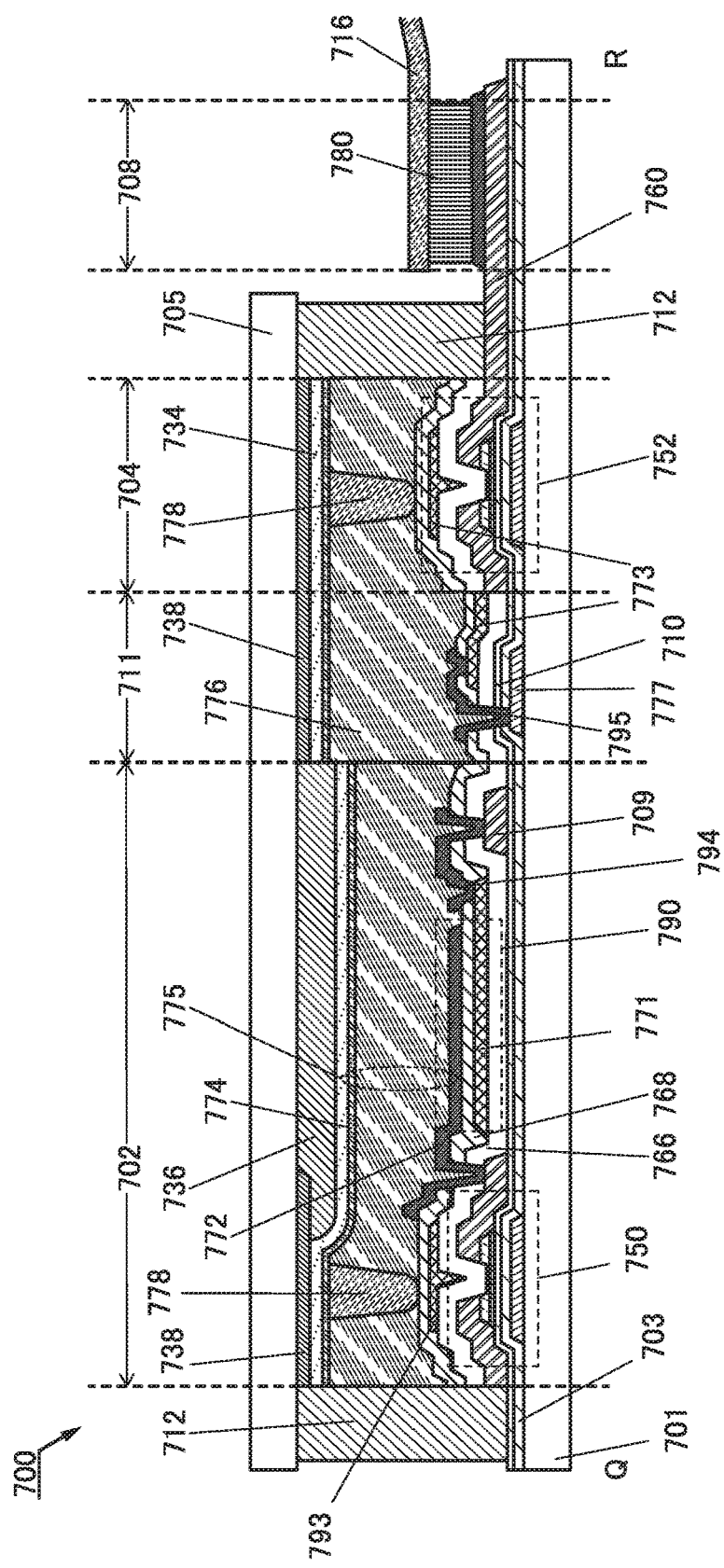
FIG. 15 is a cross-sectional view illustrating one embodiment of the present invention.

In this embodiment, an example of a structure that is partly different from that of FIG. 2 shown in Embodiment 1 will be described with reference to FIG. 15. Note that the same reference numerals are used for the same portions as those in FIG. 2, and description of these portions is omitted here.

In this embodiment, an example will be described below, in which a conductive film 793 serving as a back gate is provided in the transistor 750 in the pixel portion, the connection structure of the common electrode 771 and the capacitor line 709 is partly different from that in FIG. 2, and the connection structure in the connection portion 711 is different from that in FIG. 2.

The conductive film 793 can be formed in the same step as the conductive film 773 and can be manufactured without an increase in the number of manufacturing steps.

A conductive film 794 is formed in the same step as the conductive film 772 and has a function of electrically connecting the common electrode 771 and the capacitor line 709 to each other through a contact hole.

In the connection portion 711, a conductive film 795 is formed in the same step as the conductive film 772 and has a function of electrically connecting the connection electrode 777 and the conductive film 773 to each other through a contact hole.

The conductive films 794 and 795 formed in the same step as the conductive film 772 can be electrically connected to another wiring such as the connection electrode 777 or the conductive film 773 without increasing the number of masks.

This embodiment can be implemented in an appropriate combination with any of the structures described in the other embodiments.

Embodiment 9

In this embodiment, an example that is partly different from the structure of FIG. 2 shown in Embodiment 1 will be described with reference to FIG. 16. Note that the same reference numerals are used for the same portions as those in FIG. 2, and description of the portions with the same reference numerals is omitted here.

Figure 16:
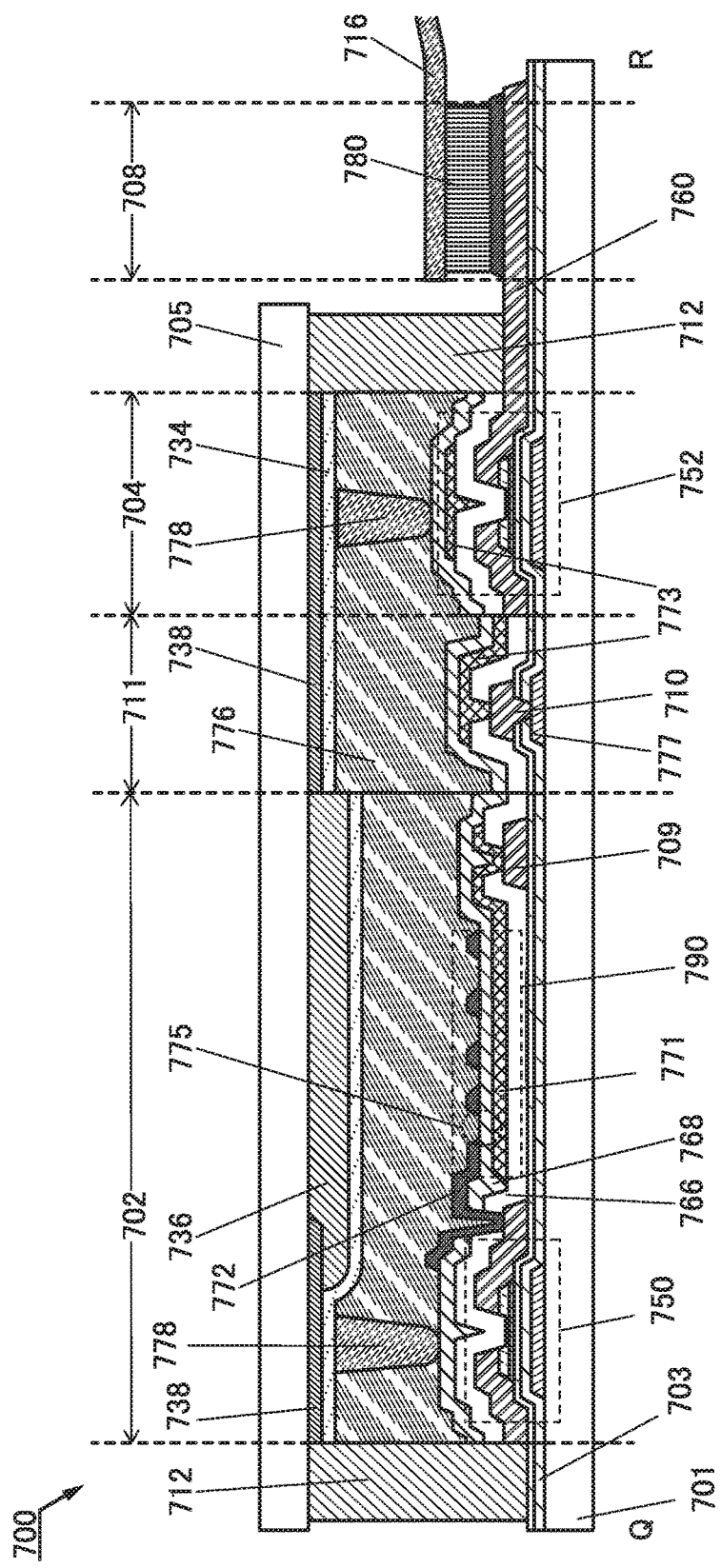
FIG. 16 is a cross-sectional view illustrating one embodiment of the present invention.

FIG. 16 illustrates a fringe field switching (FFS) mode liquid crystal display device.

The alignment of liquid crystal is unlikely to be disordered when the cell gap is somewhat changed by a press in liquid crystal panels in which horizontal electric field is applied to liquid crystal such as an FFS mode liquid crystal display device, as compared to in liquid crystal panels in which vertical electric field is applied to liquid crystal such as a twisted nematic (TN) liquid crystal panel. However, the horizontal electric field mode liquid crystal panel does not include an electrode on a counter substrate that faces an element substrate on which a transistor is provided.

The FFS mode liquid crystal display device of has a slit-shaped opening in the conductive film 772 functioning as a pixel electrode, and alignment of liquid crystal molecules is controlled by applying an electric field generated between the pixel electrode and a common electrode 771 to the liquid crystal in the opening.

The FFS mode liquid crystal display device has a high aperture ratio, a wide viewing angle, and an effect of improving an image contrast.

This embodiment can be implemented in an appropriate combination with any of the structures described in the other embodiments.

Embodiment 10

In this embodiment, an example that is partly different from the structure of FIG. 2 shown in Embodiment 1 will be described with reference to FIG. 17. Note that the same reference numerals are used for the same portions as those in FIG. 2, and description of the portions with the same reference numerals is omitted here.

In the capacitor 790, two capacitor formation regions are formed in one common electrode, and dielectrics are provided between each of two pairs of electrodes. The structure in which two capacitor formation regions are formed in one common electrode can also be referred to as a structure in which a first capacitor and a second capacitor overlap with each other. Specifically, dielectrics and electrodes are formed over and below the common electrode 771, so that a plurality of capacitor formation regions are stacked. The conductive film 772 serving as a pixel electrode is used as one electrode of a first capacitor formation region; the common electrode 771 formed in the same step as the gate electrode of the transistor 752 is used as the other electrode of the first capacitor formation region. An insulating film 791 is used as the dielectric between one pair of electrodes. The common electrode 771 is used as one electrode of a second capacitor formation region; low-resistance oxide films 718a and 718b are used as the other electrode of the second capacitor formation region. The conductive film 772 and the low-resistance oxide films 718a and 718b are electrically connected to each other through a drain electrode, so that they have the same potential. Being provided in contact with the insulating film 768 formed of a silicon nitride film or the like, the oxide film 718b has low resistance and serves as a conductive film. The insulating film 768 is used as the dielectric between the other pair of electrodes. As each of the insulating films 768 and 791, an inorganic insulating film such as a silicon nitride film, an aluminum nitride film, a silicon nitride oxide film, an aluminum nitride oxide film, or the like is used.

In the case where the display device 700 is a transmissive liquid crystal display device, a conductive film that transmits visible light is preferably used as the conductive film 772 and the common electrode 771. For example, a material including one kind selected from indium (In), zinc (Zn), and tin (Sn) is preferably used for the conductive film that transmits visible light.

The common electrode 771 is electrically connected to the capacitor line 709.

The connection electrode 710 and the capacitor line 709 are formed in the same step as conductive films serving as source electrodes and drain electrodes of the transistors 750 and 752.

Note that the connection electrode 710 and the capacitor line 709 may be formed using a conductive film which is formed in a different step from source electrodes and drain electrodes of the transistors 750 and 752; for example, a conductive film serving as a gate electrode may be used. In the case where the connection electrode 710 and the capacitor line 709 are formed using a material including a copper element, signal delay or the like due to wiring resistance is reduced, which enables display on a large screen.

The FPC terminal portion 708 includes the connection electrode 760, a conductive film 779, the anisotropic conductive film 780, and the FPC 716. Note that the connection electrode 760 is formed in the same step as conductive films serving as the source electrodes and the drain electrodes of the transistor 750 and 752. The connection electrode 760 is electrically connected to a terminal included in the conductive film 779 and the FPC 716 through the anisotropic conductive film 780. The conductive film 779 can be formed using the same material and the same step as the conductive film 772 serving as a pixel electrode.

For example, a glass substrate can be used as the first substrate 701 and the second substrate 705. A flexible substrate may be used as the first substrate 701 and the second substrate 705. Examples of the flexible substrate include a plastic substrate.

Embodiment 11

In this embodiment, an example that is partly different from the structure of FIGS. 8A and 8B and FIGS. 9A to 9C shown in Embodiment 1 will be described with reference to FIGS. 18A and 18B and FIGS. 19A to 19C. Note that the same reference numerals are used for the same portions as those in FIGS. 8A and 8B and FIGS. 9A to 9C, and description of the portions with the same reference numerals is omitted here.

Figure 17:
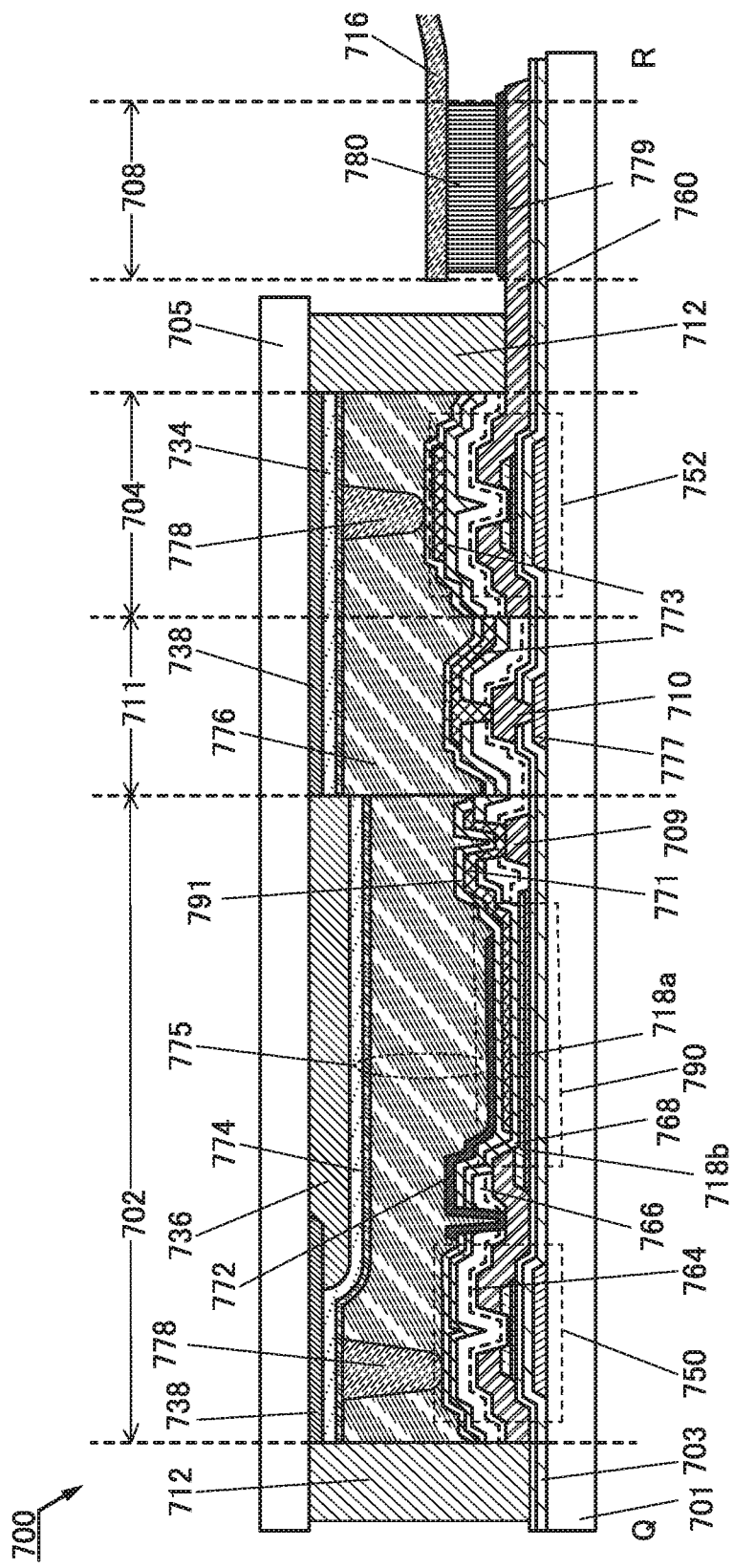
FIG. 17 is a cross-sectional view illustrating one embodiment of the present invention.

An example of manufacturing steps of the transistor 752 illustrated in FIG. 17 is described below. In the transistor 752, a gate electrode is provided over and under the oxide semiconductor layer.

The transistor 170 having the same structure as the transistor 752 is described in the description below. FIGS. 19A to 19C are cross-sectional views illustrating manufacturing steps of the transistor 170 illustrated in FIG. 18B. Since steps for manufacturing the transistor 170 is almost the same as that for manufacturing the transistor 100 except that the step of providing a second gate electrode over the gate electrode of the transistor 100 is added, the detailed description thereof is omitted.

The transistor 170 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the conductive film 112a functioning as a source electrode electrically connected to the oxide semiconductor film 108, the conductive film 112b functioning as a drain electrode electrically connected to the oxide semiconductor film 108, the insulating film 114 over the oxide semiconductor film 108, the insulating film 116 over the insulating film 114, the conductive films 120a and 120b over the insulating film 116, and the insulating film 118 over the conductive film 120a. The insulating films 114, 116, and 118 function as second gate insulating films of the transistor 170. The conductive film 120a is electrically connected with the conductive film 112b through an opening 142c provided in the insulating films 114, 116, and 118. The conductive film 120a in the transistor 170 functions as, for example, a pixel electrode used for a display device. The conductive film 120b in the transistor 170 functions as a second gate electrode (also referred to as a back gate electrode).

Figure 18A:
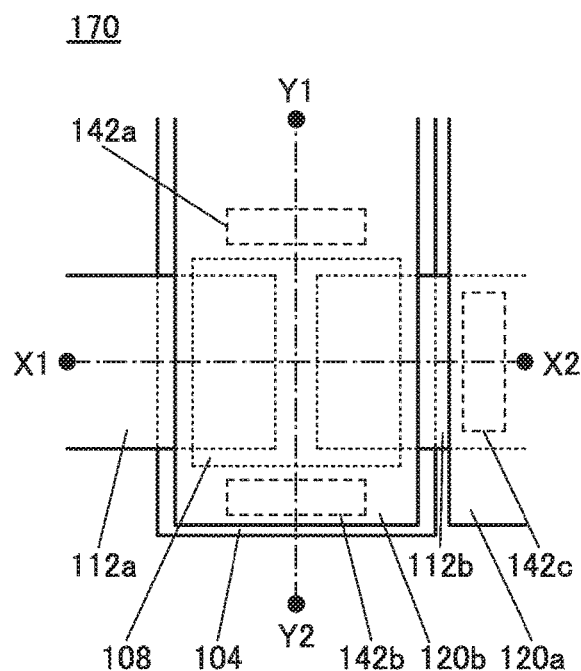
FIGS. 18A and 18B are a top view and cross-sectional views illustrating one embodiment of the invention.
Figure 18B:
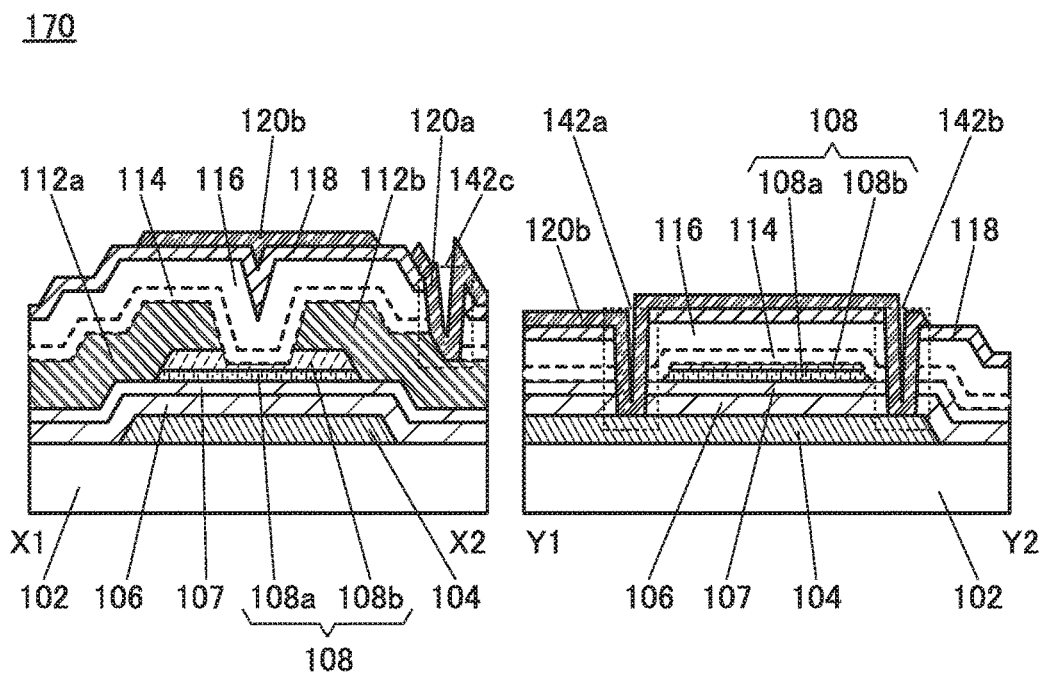
Figure 19A:
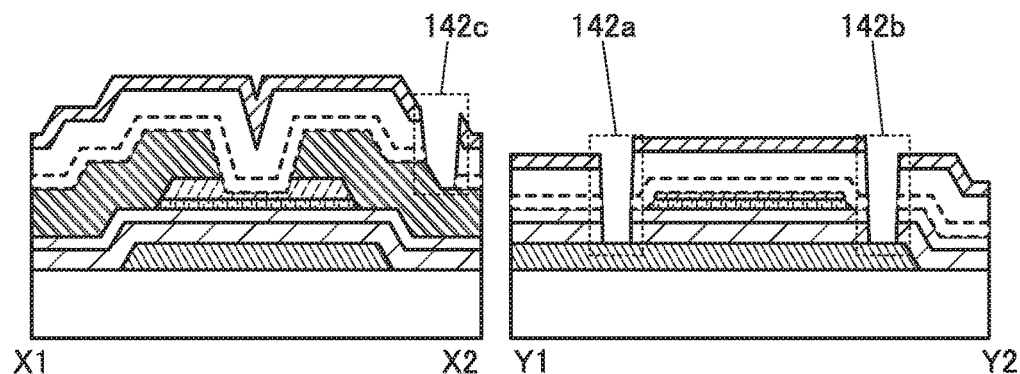
FIGS. 19A to 19C are cross-sectional views each illustrating an embodiment of the present invention.
Figure 19B:
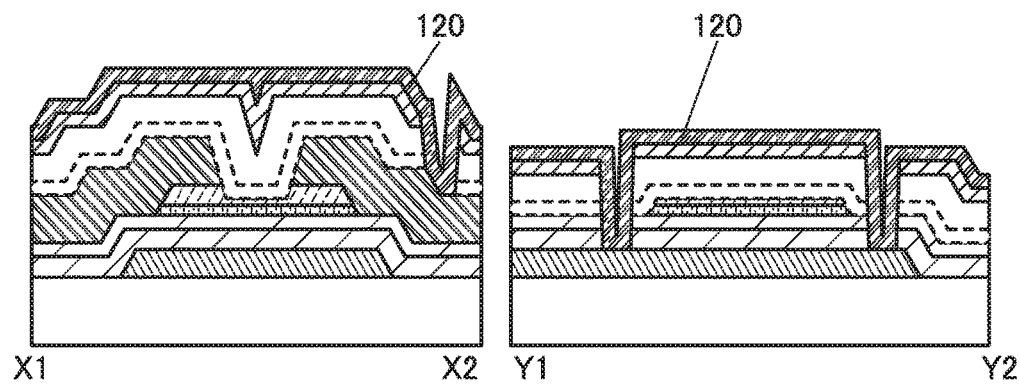
Figure 19C:
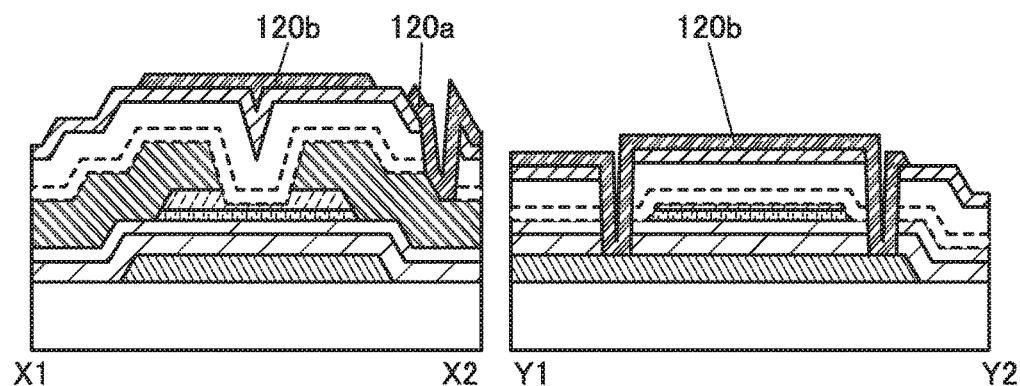

As illustrated in FIG. 18B, the conductive film 120b is connected to the conductive film 104 functioning as the first gate electrode through the openings 142a and 142b provided in the insulating films 106, 107, 114, 116 and 118. Accordingly, the conductive film 120b and the conductive film 104 are supplied with the same potential.

Note that although the structure in which the openings 142a and 142b are provided so that the conductive film 120b and the conductive film 104 are connected to each other is described in this embodiment, one embodiment of the present invention is not limited thereto. For example, a structure in which only one of the openings 142a and 142b is provided so that the conductive film 120b and the conductive film 104 are connected to each other, or a structure in which the openings 142a and 142b are not provided and the conductive film 120b and the conductive film 104 are not connected to each other may be employed. Note that in the case where the conductive film 120b and the conductive film 104 are not connected to each other, it is possible to apply different potentials to the conductive film 120b and the conductive film 104.

As illustrated in FIG. 18B, the oxide semiconductor film 108 is positioned to face the conductive film 104 that functions as a first gate electrode and the conductive film 120b that functions as the second gate electrode, and is sandwiched between the two conductive films functioning as gate electrodes. The lengths in the channel length direction and the channel width direction of the conductive film 120b functioning as the second gate electrode are longer than those in the channel length direction and the channel width direction of the oxide semiconductor film 108. The whole oxide semiconductor film 108 is covered with the conductive film 120b with the insulating films 114, 116, and 118 provided therebetween. Since the conductive film 120b functioning as a second gate electrode is connected to the conductive film 104 functioning as a first gate electrode through the openings 142a and 142b provided in the insulating films 106, 107, 114, 116, and 118, a side surface of the oxide semiconductor film 108 in the channel width direction faces the conductive film 120b functioning as a second gate electrode with the insulating films 114, 116, and 118 positioned therebetween.

In other words, in the channel width direction of the transistor 170, the conductive film 104 functioning as a first gate electrode and the conductive film 120b functioning as a second gate electrode are connected to each other through the openings provided in the insulating films 106 and 107 functioning as first gate insulating films, and the insulating films 114 and 116 functioning as second gate insulating films; and the conductive film 104 and the conductive film 120b surround the oxide semiconductor film 108 with the insulating films 106 and 107 functioning as first gate insulating films, and the insulating films 114 and 116 functioning as second gate insulating films positioned therebetween.

With such a structure, the oxide semiconductor film 108 included in the transistor 170 can be electrically surrounded by electric fields of the conductive film 104 functioning as a first gate electrode and the conductive film 120b functioning as a second gate electrode. A device structure of a transistor, like that of the transistor 170, in which electric fields of a first gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor film 108 by the conductive film 104 functioning as a first gate electrode; therefore, the current drive capability of the transistor 170 can be improved and high on-state current characteristics can be obtained. Since the on-state current can be increased, it is possible to reduce the size of the transistor 170. In addition, since the transistor 170 has a structure in which the oxide semiconductor film 108 is surrounded by the conductive film 104 functioning as a first gate electrode and the conductive film 120b functioning as a second gate electrode, the mechanical strength of the transistor 170 can be increased.

Note that the other components of the transistor 170 are the same as those of the transistor 100 described above, and an effect similar to that of the transistor 100 can be obtained.

Next, a method for manufacturing the transistor 170, which is one embodiment of the present invention, is described in detail with reference to FIGS. 19A to 19C. FIGS. 19A to 19C are cross-sectional views illustrating a method for manufacturing a semiconductor device.

First, steps similar to those in the manufacturing method of the transistor 100 described above are performed (the steps illustrated in FIGS. 3A to 3C, FIGS. 4A to 4C, FIGS. 5A to 5C, FIGS. 6A and 6B, and FIG. 7A).

Next, a mask is formed over the insulating film 118 through a lithography process, and the opening 142c is formed in a desired region in the insulating films 114, 116, and 118. In addition, a mask is formed over the insulating film 118 through a lithography process, and the openings 142a and 142b are formed in desired regions in the insulating films 106, 107, 114, 116, and 118. Note that the opening 142c reaches the conductive film 112b. The openings 142a and 142b reach the conductive film 104 (see FIG. 19A).

Note that the openings 142a and 142b and the opening 142c may be formed in the same step or may be formed by different steps. In the case where the openings 142a and 142b and the opening 142c are formed in the same step, for example, a gray-tone mask or a half-tone mask can be used. Moreover, the openings 142a and 142b may be formed in some steps. For example, the insulating films 106 and 107 are processed and then the insulating films 114, 116, and 118 are processed.

Next, the conductive film 120 is formed over the insulating film 118 to cover the openings 142a, 142b, and 142c (see FIG. 19B).

For the conductive film 120, for example, a material containing one of indium (In), zinc (Zn), and tin (Sn) can be used. In particular, the conductive film 120 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin silicon oxide (ITSO). The conductive film 120 can be formed by a sputtering method, for example. In this embodiment, a 110-nm-thick ITSO film is formed by a sputtering method.

Next, a mask is formed over the conductive film 120 through a lithography process, and the conductive film 112 is processed into desired shapes to form the conductive films 120a and 120b (see FIG. 19C).

To form the conductive films 120a and 120b, for example, a dry etching method, a wet etching method, or a combination of a dry etching method and a wet etching method is used. In this embodiment, a wet etching method is employed for processing the conductive film 120 into the conductive films 120a and 120b.

Through the above process, the transistor 170 illustrated in FIGS. 18A and 18B can be manufactured.

The structures of the transistors of this embodiment can be freely combined with each other. For example, the transistor 100 shown in FIGS. 7A and 7B can be used as a transistor in a pixel portion of a display device, and the transistor 170 shown in FIGS. 18A and 18B can be used as a transistor in a gate driver of a display device.

The common electrode 771 in the pixel portion and the conductive film 120b (back gate electrode) of a transistor in the driver can be manufactured in the same process; thus, the manufacturing process can be shortened.

This application is based on Japanese Patent Application serial no. 2015-026947 filed with Japan Patent Office on Feb. 13, 2015, and Japanese Patent Application serial no. 2015-026867 filed with Japan Patent Office on Feb. 13, 2015, the entire contents of which are hereby incorporated by reference.

What is claimed is:

1. A semiconductor device comprising:
    a first transistor comprising a gate electrode over a substrate;
    a first electrode electrically connected to the first transistor, the first electrode being a pixel electrode;
    a second transistor comprising a first gate electrode over the substrate;
    a second electrode overlapping with the first gate electrode of the second transistor;
    a third electrode over the substrate, the third electrode being supplied with a fixed potential, and
    a fourth electrode comprising a low-resistance oxide film over the substrate;
    wherein the second electrode and the third electrode are formed by processing a same light-transmitting conductive film comprising a light-transmitting material,
    wherein a first capacitor is formed in a region where the first electrode and the third electrode overlap with each other with an insulating film provided therebetween, and
    wherein a second capacitor is formed in a region where the third electrode and the fourth electrode overlap with each other.

2. The semiconductor device according to claim 1, wherein the second electrode is a back gate electrode of the second transistor.

3. The semiconductor device according to claim 1, wherein the gate electrode of the first transistor and the first gate electrode of the second transistor are on a same surface.

4. The semiconductor device according to claim 1, wherein the light-transmitting material is selected from indium tin oxide, indium oxide including tungsten oxide, indium zinc oxide including tungsten oxide, indium oxide including titanium oxide, indium tin oxide including titanium oxide, indium zinc oxide, and indium tin oxide to which silicon oxide is added.

5. The semiconductor device according to claim 1, wherein the second transistor is in a driver circuit.

6. The semiconductor device according to claim 1, wherein the insulating film is a silicon nitride film.

7. The semiconductor device according to claim 1, wherein the semiconductor device is a liquid crystal display device.

8. The semiconductor device according to claim 1,
wherein the second transistor further comprises an oxide semiconductor layer over the first gate electrode, and
wherein the oxide semiconductor layer is surrounded by the first gate electrode and the second electrode in a channel width direction of the second transistor.

9. A semiconductor device comprising:
a first transistor comprising a gate electrode over a substrate and a first oxide semiconductor layer over the gate electrode, the first oxide semiconductor layer comprising a channel formation region;
a first electrode electrically connected to the first transistor, the first electrode being a pixel electrode;
a second transistor comprising a first gate electrode over the substrate and a second oxide semiconductor layer over the first gate electrode, the second oxide semiconductor layer comprising a channel formation region;
a first insulating film over the channel formation region of the first transistor and the channel formation region of the second transistor;
a second insulating film over the first insulating film;
a second electrode overlapping with the first gate electrode of the second transistor;
a third electrode over the substrate, the third electrode being supplied with a fixed potential, and
a fourth electrode comprising a low-resistance oxide film over the substrate,
wherein the second electrode and the third electrode are formed by processing a same light-transmitting conductive film comprising a light-transmitting material,
wherein a first capacitor is formed in a region where the first electrode and the third electrode overlap with each other with the second insulating film provided therebetween, and
wherein a second capacitor is formed in a region where the third electrode and the fourth electrode overlap with each other.

10. The semiconductor device according to claim 9, wherein the second electrode is a back gate electrode of the second transistor.

11. The semiconductor device according to claim 9, wherein the gate electrode of the first transistor and the first gate electrode of the second transistor are on a same surface.

12. The semiconductor device according to claim 9, wherein the light-transmitting material is selected from indium tin oxide, indium oxide including tungsten oxide, indium zinc oxide including tungsten oxide, indium oxide including titanium oxide, indium tin oxide including titanium oxide, indium zinc oxide, and indium tin oxide to which silicon oxide is added.

13. The semiconductor device according to claim 9, wherein the second transistor is in a driver circuit.

14. The semiconductor device according to claim 9, wherein the second insulating film is a silicon nitride film.

15. The semiconductor device according to claim 9, wherein the semiconductor device is a liquid crystal display device.

16. The semiconductor device according to claim 9, wherein the first oxide semiconductor layer and the second oxide semiconductor layer comprise indium, gallium, and zinc.

17. The semiconductor device according to claim 9,
wherein the second oxide semiconductor layer is surrounded by the first gate electrode and the second electrode in a channel width direction of the second transistor.

18. A semiconductor device comprising:
a first transistor comprising a gate electrode over a substrate;
a first electrode electrically connected to the first transistor, the first electrode being a pixel electrode;
a second transistor comprising a first gate electrode over the substrate;
a second electrode overlapping with the first gate electrode of the second transistor;
a third electrode over the substrate, the third electrode being supplied with a fixed potential; and
a fourth electrode comprising a low-resistance oxide film over the substrate,
wherein the second electrode and the third electrode are formed by processing a same light-transmitting conductive film comprising a light-transmitting material,
wherein a first capacitor is formed in a region where the first electrode and the third electrode overlap with each other, and
wherein a second capacitor is formed in a region where the third electrode and the fourth electrode overlap with each other.

19. The semiconductor device according to claim 18, wherein the second electrode is a back gate electrode of the second transistor.

20. The semiconductor device according to claim 18, wherein the gate electrode of the first transistor and the first gate electrode of the second transistor are on a same surface.

21. The semiconductor device according to claim 18, wherein the light-transmitting material is selected from indium tin oxide, indium oxide including tungsten oxide, indium zinc oxide including tungsten oxide, indium oxide including titanium oxide, indium tin oxide including titanium oxide, indium zinc oxide, and indium tin oxide to which silicon oxide is added.

22. The semiconductor device according to claim 18, wherein the second transistor is in a driver circuit.

23. The semiconductor device according to claim 18, wherein the semiconductor device is a liquid crystal display device.

24. The semiconductor device according to claim 18,
wherein the second transistor further comprises an oxide semiconductor layer over the first gate electrode, and
wherein the oxide semiconductor layer is surrounded by the first gate electrode and the second electrode in a channel width direction of the second transistor.

* * * * *